US010930358B2

(12) United States Patent
Kim et al.

(10) Patent No.: US 10,930,358 B2
(45) Date of Patent: Feb. 23, 2021

(54) MEMORY SYSTEM AND METHOD OF OPERATING THE SAME

(71) Applicant: SK hynix Inc., Icheon-si (KR)

(72) Inventors: Dae Sung Kim, Icheon-si (KR); Kyung Bum Kim, Suwon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/578,928

(22) Filed: Sep. 23, 2019

(65) Prior Publication Data

US 2020/0265903 A1  Aug. 20, 2020

(30) Foreign Application Priority Data

Feb. 14, 2019  (KR) .......................... 10-2019-0017442

(51) Int. Cl.
*G11C 11/56* (2006.01)
*G11C 16/26* (2006.01)
*G11C 16/34* (2006.01)
*G11C 16/04* (2006.01)
*G11C 16/30* (2006.01)

(52) U.S. Cl.
CPC ........ *G11C 16/349* (2013.01); *G11C 11/5671* (2013.01); *G11C 16/0483* (2013.01); *G11C 16/26* (2013.01); *G11C 16/30* (2013.01); *G11C 11/5642* (2013.01); *G11C 2211/5632* (2013.01); *G11C 2211/5641* (2013.01)

(58) Field of Classification Search
CPC .............. G11C 16/349; G11C 11/5671; G11C 16/0483; G11C 16/26; G11C 16/30
USPC ........... 365/185.03, 185.09, 185.02, 185.18, 365/189.15
See application file for complete search history.

(56) References Cited

U.S. PATENT DOCUMENTS

| 8,725,929 | B1 * | 5/2014 | Yang ...................... G11C 16/28 711/103 |
| 9,007,854 | B1 * | 4/2015 | Nemati Anaraki ..... G06F 11/10 365/189.15 |
| 9,368,225 | B1 * | 6/2016 | Pinkovich .............. G11C 7/065 |
| 2008/0106936 | A1 * | 5/2008 | Yang ...................... G11C 16/10 365/185.03 |

(Continued)

FOREIGN PATENT DOCUMENTS

KR   10-2017-0058066   5/2017
KR   10-2018-0070974   6/2018

*Primary Examiner* — Ly D Pham
(74) *Attorney, Agent, or Firm* — Perkins Coie LLP

(57) ABSTRACT

Provided herein may be a memory system and a method of operating the same. The memory system may include a memory device including memory cells, each having any one of an erased state or one of a plurality of programmed states, and a memory controller configured to estimate an optimal read voltage associated with at least one of the erased state or one of the programmed states based on a threshold voltage distribution corresponding to at least one of the programmed states. The memory controller may include a threshold voltage distribution checker configured to check a first threshold voltage distribution corresponding to a first programmed state, among the programmed states, and determine an average threshold voltage of the first threshold voltage distribution, and an optimal read voltage estimator configured to estimate a second optimal read voltage corresponding to a second side of the first threshold voltage distribution.

20 Claims, 20 Drawing Sheets

(56) References Cited

U.S. PATENT DOCUMENTS

| | | | |
|---|---|---|---|
| 2011/0038205 A1* | 2/2011 | Chou | G11C 16/26 365/185.03 |
| 2017/0125110 A1* | 5/2017 | Sankaranarayanan | G11C 11/5642 |
| 2017/0140802 A1* | 5/2017 | Jeon | G11C 16/28 |
| 2018/0068736 A1* | 3/2018 | Kim | G11C 29/028 |
| 2019/0080747 A1* | 3/2019 | Sakurada | G11C 11/5642 |
| 2019/0267099 A1* | 8/2019 | Yoo | G11C 16/349 |
| 2019/0295659 A1* | 9/2019 | Hong | G06F 11/1012 |
| 2020/0201569 A1* | 6/2020 | Hsiao | G06F 3/0604 |

* cited by examiner

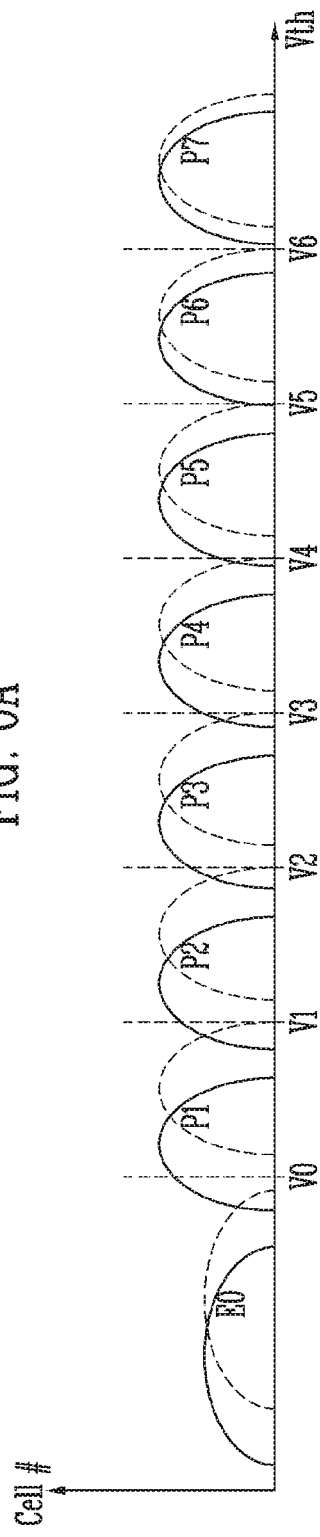
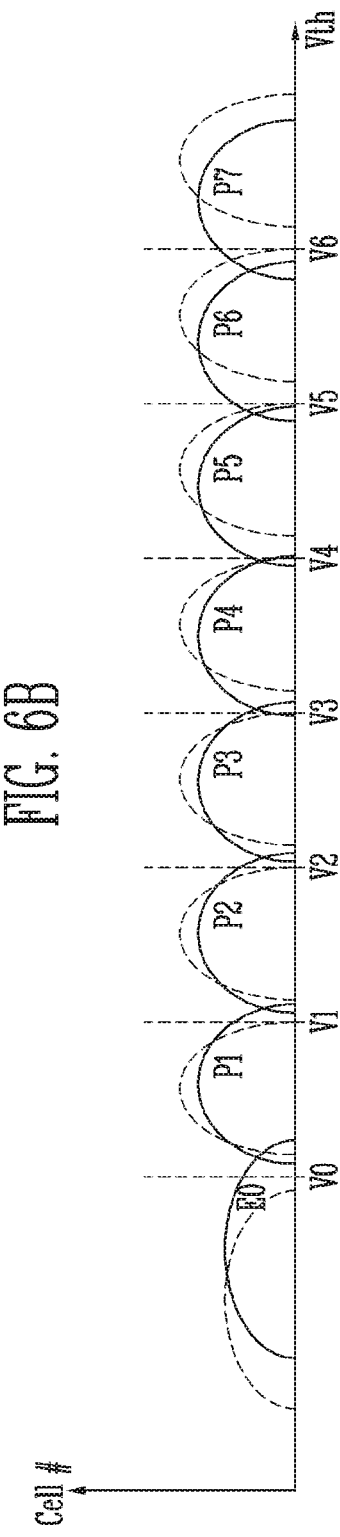

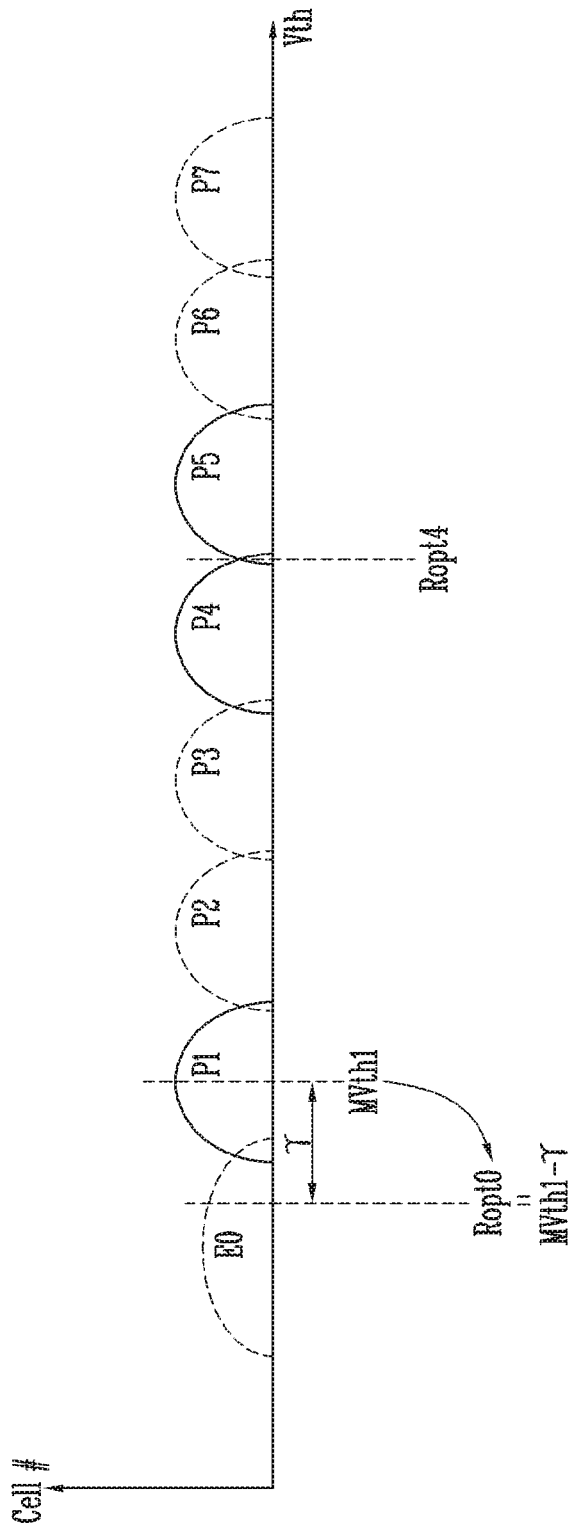

FIG. 10

| P/E cycle (PEC) | Retention time (RT) | P1 | P2 | P3 | P4 | P5 | P6 |
|---|---|---|---|---|---|---|---|
| 0 < PEC ≤ 1000 | 0 < RT ≤ 100 | α11 | α21 | α31 | α41 | α51 | α61 |
| | 100 < RT ≤ 200 | α12 | α22 | α32 | α42 | α52 | α62 |
| | ... | ... | ... | ... | ... | ... | ... |
| 1000 < PEC ≤ 2000 | 0 < RT ≤ 100 | α13 | α23 | α33 | α43 | α53 | α63 |
| | 100 < RT ≤ 200 | α14 | α24 | α34 | α44 | α54 | α64 |
| | ... | ... | ... | ... | ... | ... | ... |
| ... | | | | | | | |

FIG. 13

| P/E cycle (PEC) | Retention time (RT) | P1-P2 | P2-P3 | P3-P4 | P4-P5 | P5-P6 |
|---|---|---|---|---|---|---|
| 0 < PEC ≤ 1000 | 0 < RT ≤ 100 | $\beta_{11}$ | $\beta_{21}$ | $\beta_{31}$ | $\beta_{41}$ | $\beta_{51}$ |
| | 100 < RT ≤ 200 | $\beta_{12}$ | $\beta_{22}$ | $\beta_{32}$ | $\beta_{42}$ | $\beta_{52}$ |
| | ... | ... | ... | ... | ... | ... |
| 1000 < PEC ≤ 2000 | 0 < RT ≤ 100 | $\beta_{13}$ | $\beta_{23}$ | $\beta_{33}$ | $\beta_{43}$ | $\beta_{53}$ |
| | 100 < RT ≤ 200 | $\beta_{14}$ | $\beta_{24}$ | $\beta_{34}$ | $\beta_{44}$ | $\beta_{54}$ |
| | 1 | | | | | |
| ... | ... | ... | ... | ... | ... | ... |

MEMORY SYSTEM AND METHOD OF OPERATING THE SAME

CROSS-REFERENCE TO RELATED APPLICATION

This patent document claims priority to the Korean patent application number 10-2019-0017442 filed on Feb. 14, 2019, which is incorporated herein by reference in its entirety for all purposes.

TECHNICAL FIELD

The technology and implementations disclosed in this patent document generally relate to a memory system and a method of operating the memory system, and more particularly, to a memory system and a method of operating the memory system, which can improve the reliability of data.

BACKGROUND

A memory system may include a memory controller and a memory device.

The memory device may store data or output stored data under the control of the memory controller. For example, the memory device may be implemented using volatile memory devices, which only retain data while they are powered, or using nonvolatile memory devices, which can retain data even when the supply of power is interrupted.

SUMMARY

The technology disclosed in this patent document can be implemented in various embodiments to provide a memory system and a method of operating the memory system that can estimate an optimal read voltage that reflects channel characteristics.

An embodiment of the disclosed technology may provide for a memory system. The memory system may include a memory device including memory cells, each having a state corresponding to any one of an erased state or one of a plurality of programmed states, and a memory controller in communication with the memory device and configured to estimate an optimal read voltage associated with at least one of the erased state or one of the plurality of programmed states based on a threshold voltage distribution corresponding to at least one of the plurality of programmed states. The memory controller may include a threshold voltage distribution checker configured to check a first threshold voltage distribution corresponding to a first programmed state, among the plurality of programmed states, and determine an average threshold voltage of the first threshold voltage distribution, and an optimal read voltage estimator configured to estimate a second optimal read voltage corresponding to a second side of the first threshold voltage distribution, based on the average threshold voltage of the first threshold voltage distribution and a first optimal read voltage corresponding to a first side of the first threshold voltage distribution.

An embodiment of the disclosed technology may provide for a method of operating a memory system, the memory system including memory cells, each configured to have a state corresponding to one of an erased state or one of a plurality of programmed states. The method may include determining an average threshold voltage of the first threshold voltage distribution corresponding to a first programmed state, determining a first optimal read voltage corresponding to a first side of the first threshold voltage distribution, and estimating a second optimal read voltage corresponding to a second side of the first threshold voltage distribution, based on the average threshold voltage of the first threshold voltage distribution and the first optimal read voltage.

An embodiment of the disclosed technology may provide for a memory system. The memory system may include a nonvolatile memory device configured to include memory cells, each having a state corresponding to any one of an erased state or a plurality of programmed states, and a memory controller configured to estimate an optimal read voltage corresponding to at least one of the erased state or the plurality of programmed states based on a threshold voltage distribution corresponding to at least one of the plurality of programmed states. The memory controller may include a threshold voltage distribution checker configured to check a first threshold voltage distribution corresponding to a first programmed state, among the plurality of programmed states, and determine an average threshold voltage of the first threshold voltage distribution, and an optimal read voltage estimator configured to estimate a second optimal read voltage corresponding to a second side of the first threshold voltage distribution, based on the average threshold voltage of the first threshold voltage distribution and a first optimal read voltage corresponding to a first side of the first threshold voltage distribution.

An embodiment of the disclosed technology may provide for a method of operating a memory system, the memory system including memory cells, each having a state corresponding to any one of an erased state or a plurality of programmed states. The method may include checking a first threshold voltage distribution corresponding to a first programmed state, among the plurality of programmed states, determining an average threshold voltage of the first threshold voltage distribution, determining a first optimal read voltage corresponding to a first side of the first threshold voltage distribution, and estimating a second optimal read voltage corresponding to a second side of the first threshold voltage distribution, based on the average threshold voltage of the first threshold voltage distribution and the first optimal read voltage.

BRIEF DESCRIPTION OF THE DRAWINGS

FIGS. 6A and 6B are example diagrams for explaining threshold voltage distributions of memory cells, the channel characteristics of which are changed.

FIG. 7 is an example diagram illustrating a method of estimating an optimal read voltage based on an embodiment of the disclosed technology.

FIG. 10 is an example diagram for explaining a first weight table based on an embodiment of the disclosed technology.

FIG. 13 is an example diagram for explaining a second weight table based on an embodiment of the disclosed technology.

DETAILED DESCRIPTION

Advantages and features of the disclosed technology, and methods for achieving the same will be cleared with reference to embodiments described later in detail together with the accompanying drawings. The disclosed technology is not limited to the following embodiments but embodied in other forms.

It is also noted that in this specification, "connected/coupled" refers to one component not only directly coupling another component but also indirectly coupling another component through an intermediate component. In the specification, when an element is referred to as "comprising" or "including" a component, it does not preclude another component but may further include other components unless the context clearly indicates otherwise.

Figure 1:
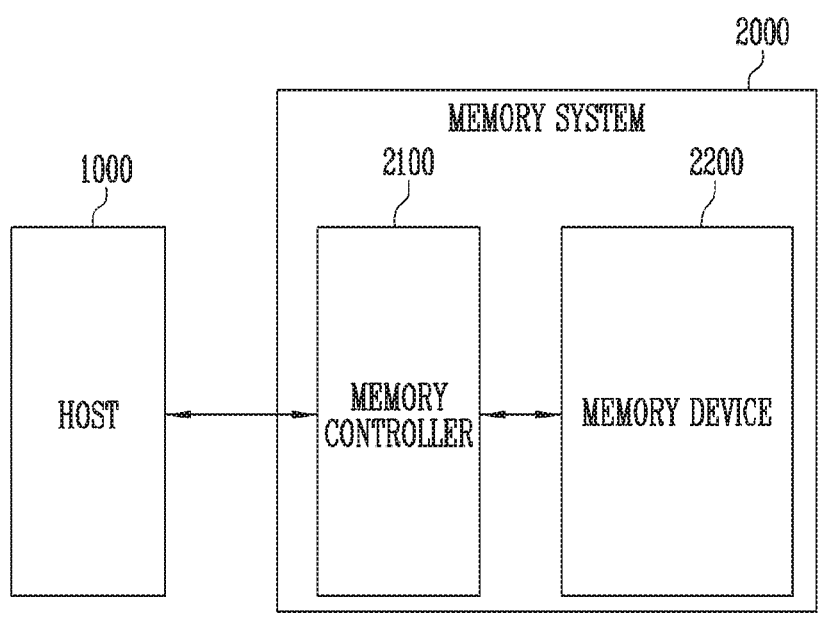
FIG. 1 is a diagram illustrating an example of a memory system based on an embodiment of the disclosed technology.

FIG. 1 is a diagram illustrating a memory system according to an embodiment of the disclosed technology.

Referring to FIG. 1, a memory system 2000 may include a memory device 2200 which stores data, and a memory controller 2100 which controls the memory device 2200 in response to a request received from a host 1000.

The host 1000 may be a device or a system that includes one or more computer processors which operate to retrieve digital information or data from the memory system 2000 or store or write digital information or data into the memory system 2000. In various applications, the host 1000 can be in various forms, including, for example, a personal computer (PC), a portable digital device, a tablet PC, a digital camera, a digital audio player, a digital multimedia player, a television, a wireless communication device, a cellular phone, console video game hardware, or a digital set-top box.

The memory controller 2100 may control the overall operation of the memory system 2000. The memory controller 2100 may perform various operations in response to requests received from the host 1000. For example, the memory controller 2100 may perform a program operation, a read operation, an erase operation, etc. on the memory device 2200. During a program operation, the memory controller 2100 may transmit a program command, an address, program data, etc. to the memory device 2200. During a read operation, the memory controller 2100 may transmit a read command, an address, etc. to the memory device 2200, and may receive read data from the memory device 2200. During an erase operation, the memory controller 2100 may provide an erase command, an address, etc. to the memory device 2200.

The memory device 2200 may be implemented as a volatile memory device in which stored data is lost when the supply of power is interrupted or as a nonvolatile memory device in which stored data is retained even when the supply of power is interrupted. The memory device 2200 may perform a program operation, a read operation, an erase operation, etc. under the control of the memory controller 2100. The memory device 2200 may include a plurality of memory blocks which store data. Each of the memory blocks may include a plurality of memory cells. The memory blocks may be classified into a single-level cell (SLC) block and an m-bit multi-level cell (MLC) block depending on the number of bits that can be stored in each memory cell. For example, in each of SLCs included in the SLC block, one bit of data may be stored, and in each of m-bit MLCs included in the m-bit MLC block, m bits of data may be stored. Here, m may be a natural number of 2 or more.

Figure 2:
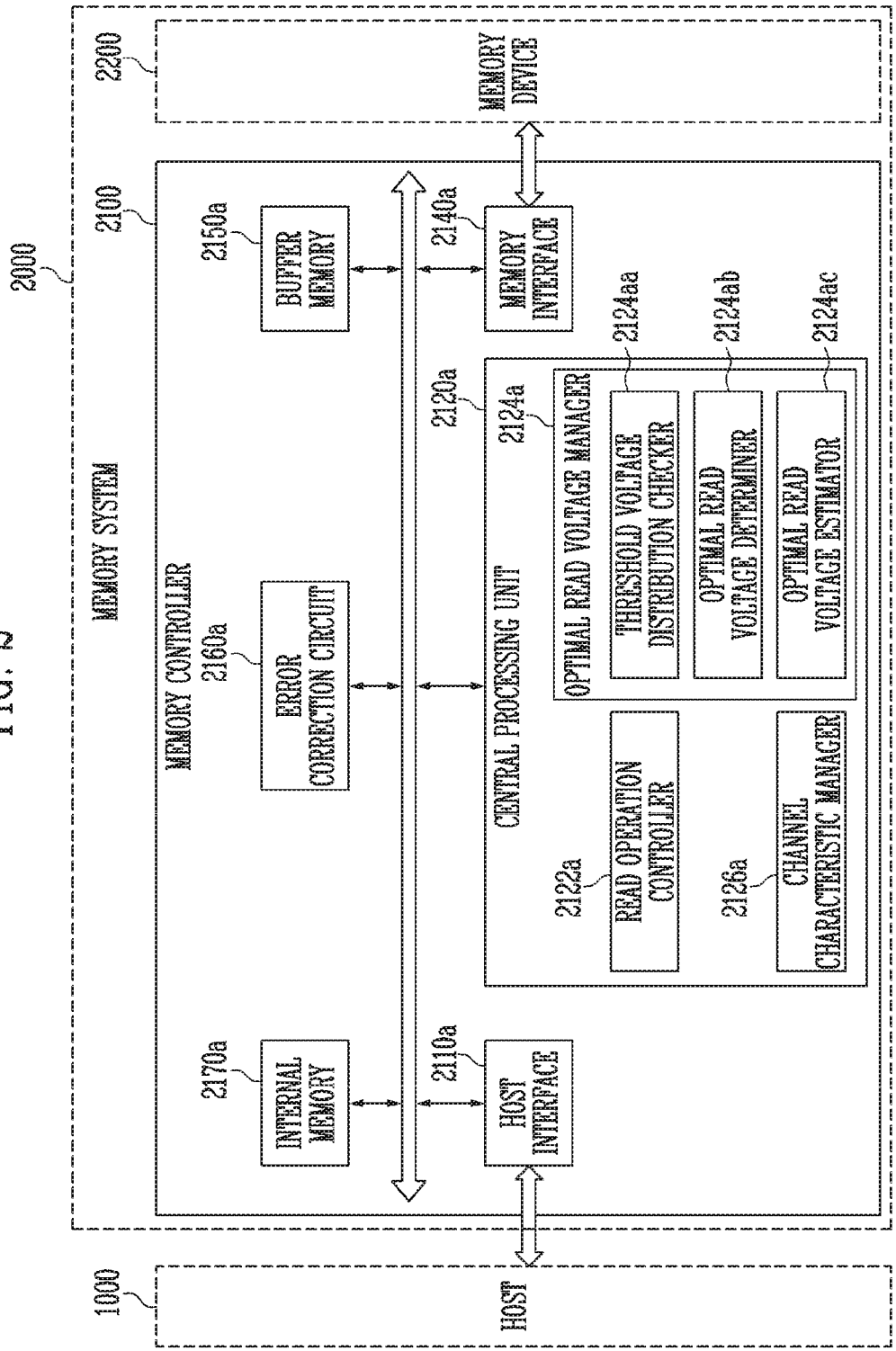
FIG. 2 is an example diagram illustrating a memory controller illustrated in FIG. 1.

FIG. 2 is an example diagram illustrating the memory controller illustrated in FIG. 1.

A memory controller 2100 implemented based on an embodiment of the disclosed technology may include a host interface 2110a, a central processing unit (CPU) 2120a, a memory interface 2140a, a buffer memory 2150a, an error correction circuit 2160a, and an internal memory 2170a. The host interface 2110a, the memory interface 2140a, the buffer memory 2150a, the error correction circuit 2160a, and the internal memory 2170a may be controlled by the CPU 2120a.

The host interface 2110a may transfer a program request, a read request, and an erase request, which are received from a host 1000, to the CPU 2120a. The host interface 2110a may store program data, received together with the program request from the host 1000, in the buffer memory 2150a. The host interface 2110a may transfer read data, stored in the buffer memory 2150a, to the host 1000. The host interface 2110a may communicate with the host 1000 using various interface protocols. For example, the host interface 2110a may communicate with the host 1000 using at least one of interface protocols, such as Non-Volatile Memory express (NVMe), Peripheral Component Interconnect-Express (PCI-E), Advanced Technology Attachment (ATA), Serial ATA (SATA), Parallel ATA (PATA), Universal Serial Bus (USB), Multi-Media Card (MMC), Enhanced Small Disk Interface (ESDI), Integrated Drive Electronics (IDE), Mobile Industry Processor Interface (MIPI), Universal Flash Storage (UFS), Small Computer System Interface (SCSI), or serial attached SCSI (SAS), but embodiments of the disclosed technology are not limited thereto.

The CPU 2120a may perform various types of calculations (operations) or generate commands and addresses so as to control the memory device 2200. For example, the CPU 2120a may generate various commands and addresses required for a program operation, a read operation, and an erase operation in response to requests received from the host interface 2110a.

The CPU 2120a may translate a logical address, included in each request received from the host interface 2110a, into a physical address so as to control the operation of the memory device 2200. The CPU 2120a may translate logical addresses into physical addresses or translate physical addresses into logical addresses by utilizing an address mapping table stored in the internal memory 2170a. The CPU 2120a may update the address mapping table when new data is programmed to the memory device 2200 or when data stored in the memory device 2200 is erased.

The CPU 2120a may randomize data or derandomize randomized data. For example, during a program operation, the CPU 2120a may randomize program data received from the host 1000, and may control the memory interface 2140a so that the randomized program data can be transmitted to the memory device 2200. For example, during a read operation, the CPU 2120a may derandomize the read data received from the memory device 2200, and may control the host interface 2110a so that the derandomized read data can be transmitted to the host 1000.

The CPU 2120a may include a read operation controller 2122a, an optimal read voltage manager 2124a, and a channel characteristic manager 2126a.

The read operation controller 2122a may control the memory device 2200 so that a first read operation is performed on memory cells. The first read operation may be a read operation for reading data from the memory device 2200 in response to a read request received from the host 1000. In other words, the first read operations may indicate a normal read operations that are performed using predetermined read threshold voltage levels (also called "read voltage levels" or "read reference values") or a normal verify operations that are performed using predetermined verify read threshold voltage levels. The read operation controller 2122a may generate a first read command and an address and transfer the generated first read command and address to the memory device 2200 so that the first read operation can be performed on memory cells. During the first read operation, preset read voltages may be used.

The read operation controller 2122a may control the memory device 2200 so that a second read operation can be performed on memory cells. The second read operation may indicate any read operation that can be performed to check as to whether there are any changes in the threshold voltage distributions of memory cells. In some implementations, the second read operation may be performed based on the result of the first read operation. For example, when the number of erroneous data bits in read data (from the first read operation) exceeds the error correction capability of the error correction circuit 2160a, the read operation controller 2122a may control the memory device 2200 so that the second read operation can be performed on the memory cells that have been read by the first read operation. The read operation controller 2122a may generate a second read command and an address and transfer the generated second read command and address to the memory device 2200 so that the second read operation can be performed on the memory cells. For example, the read operation controller 2122a may generate the second read command and transfer the generated second read command to the memory device 2200 so that the second read operation can be performed on memory cells using a plurality of read voltages having different levels.

Assuming that each of the memory cells is an m-bit MLC, each memory cell may have an erased state or any one of a plurality of programmed states.

In an embodiment, the read operation controller 2122a may set a read voltage interval so that threshold voltage distributions corresponding to at least one of a plurality of programmed states which the memory cells can have may be estimated, and may generate the second read command and transmit the generated second read command to the memory device 2200 so that the second read operation may be performed within the set read voltage interval.

The read operation controller 2122a may control the memory device 2200 so that a third read operation can be performed on memory cells. The third read operation may be a read operation for reading data from the memory device 2200 using an optimal read voltage determined as a result of performing the second read operation. The read operation controller 2122a may generate a third read command and an address and transfer the generated third read command and address to the memory device 2200 so that the third read operation can be performed on the memory cells. In the context of this patent document, the words optimal, optimized or optimum that are used in conjunction with read threshold values (read voltages) or the memory system performance are used to indicate values or conditions that provide a better performance for the memory device (e.g., higher reliability, fewer detected errors, etc.) than existing read threshold values or conditions. In this sense, the words optimum, optimized or optimal may or may not convey the best possible performance achievable by the memory device.

The optimal read voltage manager 2124a may determine or estimate an optimal read voltage for memory cells based on the read data corresponding to the second read operation. The optimal read voltage manager 2124a may include a threshold voltage distribution checker 2124aa, an optimal read voltage determiner 2124ab, and an optimal read voltage estimator 2124ac.

The threshold voltage distribution checker 2124aa may check threshold voltage distributions corresponding to at least one programmed state based on the read data corresponding to the second read operation. The threshold voltage distribution checker 2124aa may set average threshold voltages respectively corresponding to the checked threshold voltage distributions. For example, the threshold voltage distribution checker 2124aa may set a threshold voltage, corresponding to a largest number of memory cells within the corresponding threshold voltage distribution, as an average threshold voltage. The threshold voltage distribution checker 2124aa may provide information about the checked threshold voltage distributions to at least one of the optimal read voltage determiner 2124ab or the optimal read voltage estimator 2124ac. For example, the information about the threshold voltage distributions may include at least one of information about the number of memory cells corresponding to each threshold voltage or information about average threshold voltages respectively corresponding to the threshold voltage distributions.

The optimal read voltage determiner 2124ab may determine at least one optimal read voltage based on the information about threshold voltage distributions received from the threshold voltage distribution checker 2124aa.

For example, the optimal read voltage determiner 2124ab may perform a valley search operation based on the information about threshold voltage distributions. In some implementations, the valley search operation may include performing multiple reads to find a valley between two adjacent threshold voltage distributions. For example, upon receipt of information about g threshold voltage distributions arranged in a row, the optimal read voltage determiner 2124ab may search for g−1 valleys based on the received information about the g threshold voltage distributions. Here, g may be an integer of 2 or more. In an example where two adjacent threshold voltage distributions overlap at their tails, the valley between the two adjacent threshold voltage distributions may mean a point at which the two adjacent threshold voltage distributions overlap each other. The optimal read voltage determiner 2124ab may determine an optimal read voltage for distinguishing between the two adjacent threshold voltage distributions based on a threshold voltage corresponding to the found valley. For example, the optimal read voltage determiner 2124ab may regard a threshold voltage corresponding to the found valley as the optimal read voltage for distinguishing between the two adjacent threshold voltage distributions.

In an embodiment, the optimal read voltage determiner 2124ab may determine an optimal read voltage corresponding to a predetermined programmed state or an erased state by selecting one of preset values.

The optimal read voltage determiner 2124ab may provide information about determined optimal read voltages to the optimal read voltage estimator 2124ac.

The optimal read voltage estimator 2124ac may estimate optimal read voltages associated with programmed states for which threshold voltage distributions are not checked and determined, based on the information about the threshold voltage distributions received from the threshold voltage distribution checker 2124aa and the information about the optimal read voltages received from the optimal read voltage determiner 2124ab. In an embodiment, the optimal read voltage estimator 2124ac may estimate the optimal read voltages by applying weights corresponding to the channel characteristics of memory cells. The weights corresponding to the channel characteristics may be received from the channel characteristic manager 2126a. Embodiments in which the optimal read voltage estimator 2124ac estimates optimal read voltages will be described in detail later with reference to FIGS. 7 to 13, but embodiments are described in brief below. In some implementations, the weight corresponding to the channel characteristics may be determined based on information collected for each condition of the channel characteristic. For example, the weight corresponding to the channel characteristics may be determined based on information collected for each condition associated with distortion or shift of threshold voltage distributions such as program/erase cycle (P/E cycle) and data retention time.

Assuming that a first threshold voltage distribution, which is a threshold voltage distribution corresponding to a first programmed state, has been checked and determined, the optimal read voltage estimator 2124ac may estimate a second optimal read voltage corresponding to a second side of the first threshold voltage distribution based on a first optimal read voltage corresponding to a first side of the first threshold voltage distribution. In the context of this patent document, the words first side and second side that are used in conjunction with threshold voltage distribution may be used to indicate right and left tails of threshold voltage distribution.

In an embodiment, the optimal read voltage estimator 2124ac may estimate the second optimal read voltage so that the difference value between the average threshold voltage of the first threshold voltage distribution and the first optimal read voltage is equal to the difference value between the average threshold voltage of the first threshold voltage distribution and the second optimal read voltage.

In an embodiment, the optimal read voltage estimator 2124ac may estimate the second optimal read voltage in the following way. First, a weight corresponding to channel characteristics is reflected in the difference value between the average threshold voltage of the first threshold voltage distribution and the first optimal read voltage. Second, the second optimal read voltage is estimated such that the weight-reflected difference value is equal to the difference value between the average threshold voltage of the first threshold voltage distribution and the second optimal read voltage.

In an embodiment, the optimal read voltage estimator 2124ac may reflect a weight corresponding to the channel characteristics in the difference value between the first optimal read voltage and the second optimal read voltage, and may estimate an optimal read voltage between the threshold voltage distributions disposed on the second side of the first threshold voltage distribution based on the weight-reflected difference value.

The channel characteristic manager 2126a may maintain information associated with channel characteristics corresponding to memory cells. For example, the channel characteristic manager 2126a may maintain information associated with the number of iterations of program/erase operations corresponding to each memory cell. The channel characteristic manager 2126a may update the number of iterations of program operations or the number of iterations of erase operations that have been performed on each memory cell upon each program operation or erase operation performed on the corresponding memory cell. For example, the channel characteristic manager 2126a may maintain information associated with the data retention time of memory cells. The data retention time may indicate how long stored data can last. In some implementations, the data retention time may indicate a time elapsed since the program operation for writing the current data stored in each memory cell. The retention time may be initialized when an erase operation is performed on each memory cell.

The channel characteristic manager 2126a may maintain weight tables in which weights corresponding to channel characteristics are listed. When a second read operation is performed, the channel characteristic manager 2126a may check channel characteristics corresponding to memory cells. For example, the channel characteristic manager 2126a may receive a physical address of the target of the second read operation from the read operation controller 2122a, and may check the channel characteristics of the memory cells corresponding to the received physical address. The channel characteristic manager 2126a may select a weight corresponding to the checked channel characteristics from the corresponding weight table, and may provide the selected weight to the optimal read voltage estimator 2124ac. The weight tables may be created by collecting information associated with channel characteristics obtained through a device test operation.

The memory interface 2140a may communicate with the memory device 2200 using various interface protocols.

The buffer memory 2150a may temporarily store data while the memory controller 2100 is performing a certain operation on the memory device 2200. For example, program data received from the host 1000 may be temporarily stored in the buffer memory 2150a until a program operation is completed. Further, during a read operation, data read from the memory device 2200 may also be temporarily stored in the buffer memory 2150a.

The error correction circuit 2160a may perform error correction encoding on the program data, and may perform error correction decoding on the read data. The error correction circuit 2160a may have error correction capability at a predetermined level. The error correction capability may be defined by associated thresholds such as a maximum number of correctable erroneous data bit. For example, when a number of error bits in the read data does not exceed the maximum number of correctable erroneous data bit, the error correction circuit 2160a may detect and correct the error. When the number of error bits exceeds the maximum number of correctable error bits, error correction decoding may be determined as failed.

The internal memory 2170a may be used as a storage that stores various types of information required for the operation of the memory controller 2100. The internal memory 2170a may store a plurality of tables. For example, the internal memory 2170a may store an address mapping table in which logical addresses are mapped to physical addresses.

Figure 3:
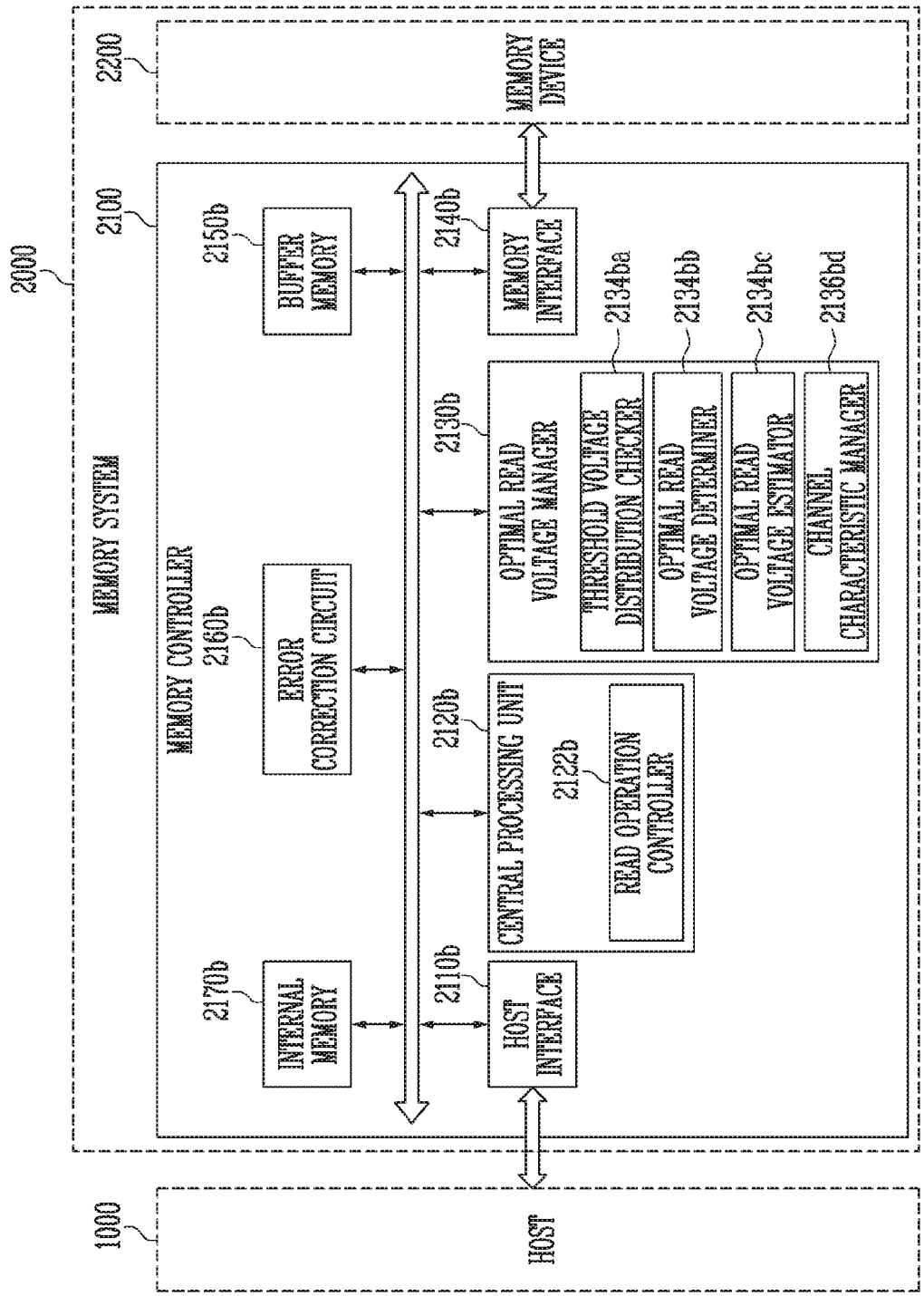
FIG. 3 is an example diagram illustrating the memory controller illustrated in FIG. 1.

FIG. 3 is an example diagram illustrating the memory controller illustrated in FIG. 1.

The memory controller 2100 implemented based on an embodiment of the disclosed technology may include a host interface 2110b, a central processing unit (CPU) 2120b, an optimal read voltage manager 2130b, a memory interface 2140b, a buffer memory 2150b, an error correction circuit 2160b, and an internal memory 2170b.

The host interface 2110b, the memory interface 2140b, the buffer memory 2150b, the error correction circuit 2160b, and the internal memory 2170b may perform operations respectively similar or identical to those of the host interface 2110a, the memory interface 2140a, the buffer memory 2150a, the error correction circuit 2160a, and the internal memory 2170a, described above with reference to FIG. 2.

The CPU 2120b may perform some of operations performed by the CPU 2120a, described above with reference to FIG. 2. For example, the CPU 2120b may include a read operation controller 2122b. The read operation controller 2122b may perform the same operation as the read operation controller 2122a, described above with reference to FIG. 2.

The optimal read voltage manager 2130b may include a threshold voltage distribution checker 2134ba, an optimal read voltage determiner 2134bb, an optimal read voltage estimator 2134bc, and a channel characteristic manager 2136bd. The threshold voltage distribution checker 2134ba, the optimal read voltage determiner 2134bb, the optimal read voltage estimator 2134bc, and the channel characteristic manager 2136bd may perform operations respectively similar or identical to those of the threshold voltage distribution checker 2124aa, the optimal read voltage determiner 2124ab, the optimal read voltage estimator 2124ac, and the channel characteristic manager 2126a, described above with reference to FIG. 2.

Figure 4:
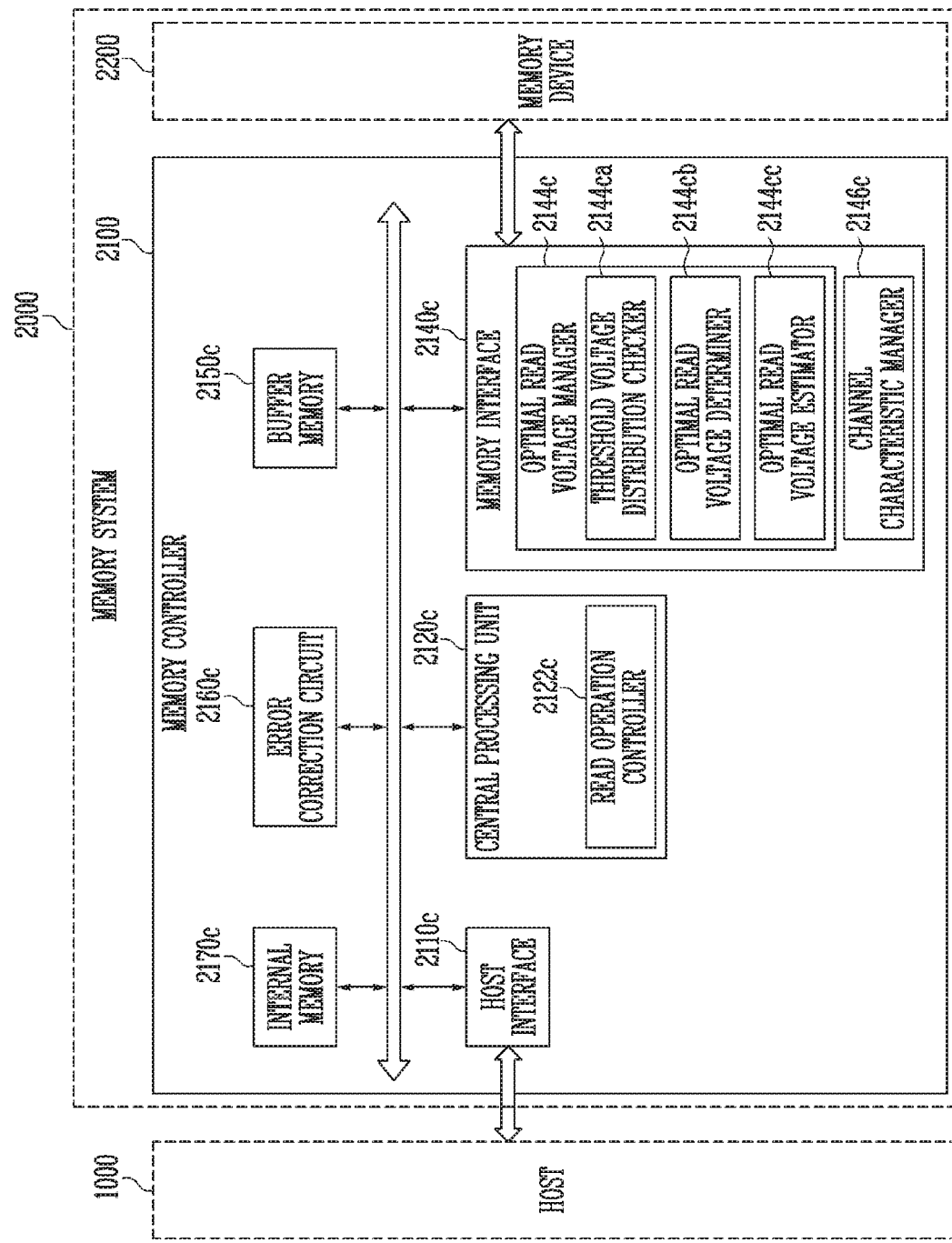
FIG. 4 is an example diagram illustrating the memory controller illustrated in FIG. 1.

FIG. 4 is an example diagram illustrating the memory controller illustrated in FIG. 1.

The memory controller 2100 implemented base on an embodiment of the disclosed technology may include a host interface 2110c, a CPU 2120c, a memory interface 2140c, a buffer memory 2150c, an error correction circuit 2160c, and an internal memory 2170c.

The host interface 2110c, the buffer memory 2150c, the error correction circuit 2160c, and the internal memory 2170c may perform operations respectively identical to those of the host interface 2110a, the buffer memory 2150a, the error correction circuit 2160a, and the internal memory 2170a, described above with reference to FIG. 2.

The CPU 2120c may be similar or identical to the CPU 2120b, described above with reference to FIG. 3. For example, the CPU 2120c may include a read operation controller 2122c, and the read operation controller 2122c may perform the same operation as the read operation controller 2122b, described above with reference to FIG. 3.

The memory interface 2140c may communicate with the memory device 2200 using various interface protocols. The memory interface 2140c may include an optimal read voltage manager 2144c and a channel characteristic manager 2146c. The optimal read voltage manager 2144c may include a threshold voltage distribution checker 2144ca, an optimal read voltage determiner 2144cb, and an optimal read voltage estimator 2144cc.

The threshold voltage distribution checker 2144ca, the optimal read voltage determiner 2144cb, the optimal read voltage estimator 2144cc, and the channel characteristic manager 2146c may perform operations respectively identical to those of the threshold voltage distribution checker 2124aa, the optimal read voltage determiner 2124ab, the optimal read voltage estimator 2124ac, and the channel characteristic manager 2126a, described above with reference to FIG. 2.

Figure 5:
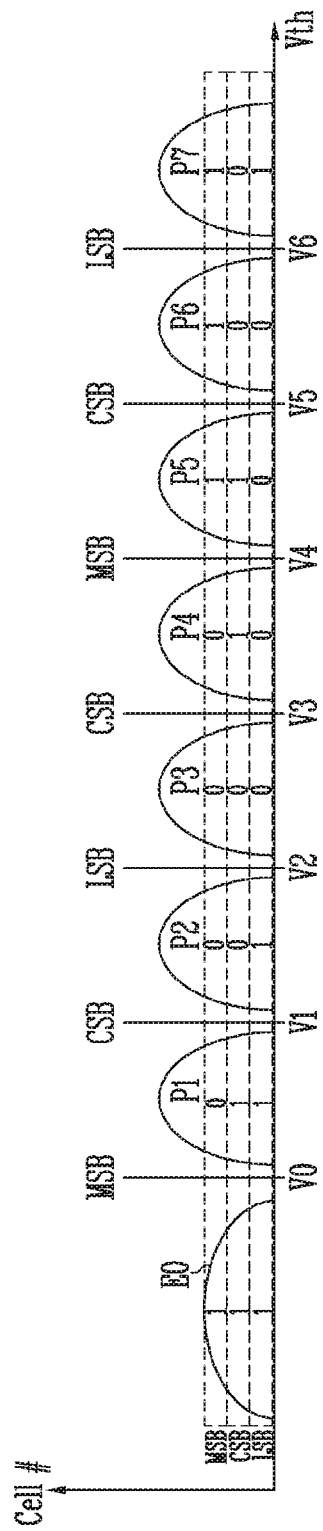
FIG. 5 is an example diagram for explaining threshold voltage distributions of memory cells.

FIG. 5 is an example diagram for explaining threshold voltage distributions of memory cells.

In FIG. 5, threshold voltage distributions of memory cells implemented based on a 3-bit MLC programming scheme, also known as a triple-level cell (TLC) programming scheme, are illustrated as an example. In the following description, a memory block that includes triple-level cells is referred to as "TLC block" for convenience only. Each memory cell included in the TLC block may have an erased state E0 or any one of seven programmed states P1 to P7. Each memory cell included in the TLC block may store three bits of data including least significant bit (LSB) data, central significant bit (CSB) data, and most significant bit (MSB) data. In FIG. 5, a horizontal axis indicates the threshold voltage Vth of memory cells and a vertical axis indicates the number of memory cells Cell# corresponding to the threshold voltage Vth.

As described above, program data may be randomized during a program operation. When the program data is randomized, threshold voltage distributions corresponding to the programmed states P1 to P7 may be formed in a similar shape, as illustrated in FIG. 5.

In some implementations, the program operation may be performed using an Incremental Step Pulse Programming (ISPP) scheme. The ISPP scheme may be a scheme for programming memory cells while gradually increasing a program voltage. In the ISPP scheme, a plurality of program loops may be performed. A single program loop may include a program pulse apply operation and a verify operation. The verify operation may be an operation of verifying whether each memory cell has been programmed to a voltage at a desired level (hereinafter referred to as a "reference voltage") or higher. As a result of the verify operation, when there is a memory cell that is not programmed to the reference voltage or a higher voltage level, a next program loop may be performed on the corresponding memory cell. In this case, a program pulse having a voltage level higher than that of a previous program loop may be applied. A next program loop may not be performed on a memory cell that has been programmed to the reference voltage or higher.

When the verify operation is performed on the memory cells, threshold voltage distributions corresponding to the programmed states P1 to P7 may be formed not to overlap each other using reference voltages V1 to V6 as boundaries between adjacent threshold voltage distribution curves. For example, a threshold voltage distribution corresponding to the programmed state P1 and a threshold voltage distribution corresponding to the programmed state P2 may be formed to be spaced apart from each other by a gap in which the reference voltage V1 is arranged. Each of the threshold voltage distributions corresponding to the programmed states P1 to P7 may have unimodal distribution characteristics or symmetric distribution characteristics. For example, each of the threshold voltage distributions corresponding to the programmed states P1 to P7 may have Gaussian distribution characteristics.

In some implementations, during a program operation, a verify operation may not be performed on memory cells corresponding to the erased state E0. Therefore, the threshold voltage distribution corresponding to the erased state E0 may have a shape different from those of the threshold voltage distributions corresponding to the programmed states P1 to P7. For example, the threshold voltage distribution corresponding to the erased state E0 may have neither unimodal distribution characteristics nor symmetric distribution characteristics.

In some implementations, each memory block may include a plurality of physical pages, and each physical page may include at least one logical page. When the memory block is an SLC block, a single physical page may include a single logical page, whereas when the memory block is an m-bit MLC block, a single physical page may include m logical pages. For example, each of physical pages included in a 3-bit MLC block (TLC block) may have three logical pages.

During a read operation, some of the reference voltages V0 to V6 may be used as read voltages depending on which logical page is targeted. For example, when the target page is an MSB page, reference voltages V0 and V4 may be used, when the target page is a CSB page, reference voltages V1, V3, and V5 may be used, and when the target page is an LSB page, reference voltages V2 and V6 may be used.

FIGS. 6A and 6B are example diagrams for explaining threshold voltage distributions of memory cells, the channel characteristics of which are changed.

When the channel characteristics of memory cells are changed, the threshold voltage distributions corresponding to an erased state E0 and programmed states P1 to P7 may be changed. For example, the channel characteristics of the memory cells may be related to at least one of the P/E cycle or data retention time. The term "program/erase cycle" may mean the number of iterations of program operations and erase operations that are performed on each memory cell. The term "retention time" or "data retention time" may mean a time elapsed since the program operation for writing the current data stored in each memory cell.

When the channel characteristics of memory cells are changed, the threshold voltage distributions corresponding to the erased state E0 and the programmed states P1 to P7 may overlap each other, or may exceed the reference voltages V0 to V6. For example, compared to threshold voltage distributions before channel characteristics are changed, the threshold voltage distributions corresponding to the erased state E0 and the programmed states P1 to P7 may be shifted to any one side, as illustrated in FIG. 6A, or the threshold voltage distributions corresponding to the erased state E0 and the programmed states P1 to P7 may overlap each other, as illustrated in FIG. 6B. In FIGS. 6A and 6B, the threshold voltage distributions present before channel characteristics are changed are indicated by dotted lines, and the threshold voltage distributions present after channel characteristics have been changed are indicated by solid lines.

During a first read operation, read voltages corresponding to the first read operation, e.g., reference voltages V0 to V6, may be used. When the first read operation using the reference voltages V0 to V6 is performed in a state in which channel characteristics are changed, as illustrated in FIGS. 6A and 6B, many errors may be present in read data corresponding to the first read operation. When the number of error bits included in the read data corresponding to the first read operation exceeds the maximum allowable number of error bits that can be corrected by the error correction circuit, error correction decoding may fail.

FIG. 7 is an example diagram illustrating a method of estimating an optimal read voltage based on an embodiment of the disclosed technology.

Channel characteristics of memory cells can change over time or due to other causes such as program and erase (PE) cycle, cell-to-cell interference, and data retention errors, and such changes in the channel characteristics of memory cells result in a threshold voltage shift. In this case, read voltages need to be shifted as much as the amount of threshold voltage shift, and thus it is important to determine an optimal read voltage under the current channel characteristics. In some embodiments of the disclosed technology, a second read operation may be performed on each threshold voltage distribution of the memory cells.

FIG. 7 shows an example where the second read operation is performed with respect to programmed states P1, P4, and P5 to determine or estimate optimal read voltages Ropt0 and Ropt4 to be used to read MSB data. However, embodiments of the disclosed technology are not limited thereto, and the second read operation corresponding to at least one programmed state may be performed to determine an optimal read voltage corresponding to at least one of program states which the memory cells can have. This procedure may also be applied to embodiments to be described with reference to the following drawings. Based on read data corresponding to the second read operation, the threshold voltage distributions of memory cells, which change with the changes in the channel characteristics may be checked. For example, as illustrated in FIG. 7, threshold voltage distributions corresponding to programmed states P1, P4, and P5 may be checked.

When the threshold voltage distributions corresponding to the programmed states P1, P4, and P5 are checked, the optimal read voltages Ropt0 and Ropt4 may be determined or estimated.

For example, the optimal read voltage Ropt4 for distinguishing adjacent programmed states P4 and P5 from each other may be determined through a valley search operation that uses threshold voltage distributions corresponding to the programmed states P4 and P5. That is, a voltage corresponding to a valley found as a result of the valley search operation may be selected as the optimal read voltage Ropt4 between the programmed states P4 and P5.

The threshold voltage distributions corresponding to the programmed states P1, P4, and P5 may be relatively easily checked or determined, but it is not easy to check a threshold voltage distribution corresponding to the erased state E0. The reason for this is that, in general, memory cells corresponding to the programmed states P1 to P7 have a positive voltage, whereas memory cells corresponding to the erased state E0 have a negative voltage, and it is not easy to apply a negative voltage to the memory cells.

Therefore, in order to estimate the optimal read voltage between the erased state E0 and the programmed state P1 adjacent to the erased state E0, the average threshold voltage MVth1 of the memory cells corresponding to the programmed state P1 may be used.

For example, a result value obtained by subtracting a value corresponding to a predetermined offset from the average threshold voltage MVth1 corresponding to the programmed state P1 may be estimated to be the optimal read voltage Ropt0 between the erased state E0 and the programmed state P1. For example, assuming that the predetermined offset is $\gamma$, the optimal read voltage Ropt0 between the erased state E0 and the programmed state P1 may be estimated by the following Equation (1):

$$Ropt0 = MVth1 - \gamma \qquad (1)$$

When an offset $\gamma$ having a fixed magnitude is used to estimate the optimal read voltage, the accuracy of estimation may be low. The reason for this is that the shapes of threshold voltage distributions and intervals between the threshold voltage distributions may change depending on the channel characteristics of memory cells. When any information in which channel characteristics are reflected is used, the optimal read voltages may be more accurately estimated.

Figure 8:
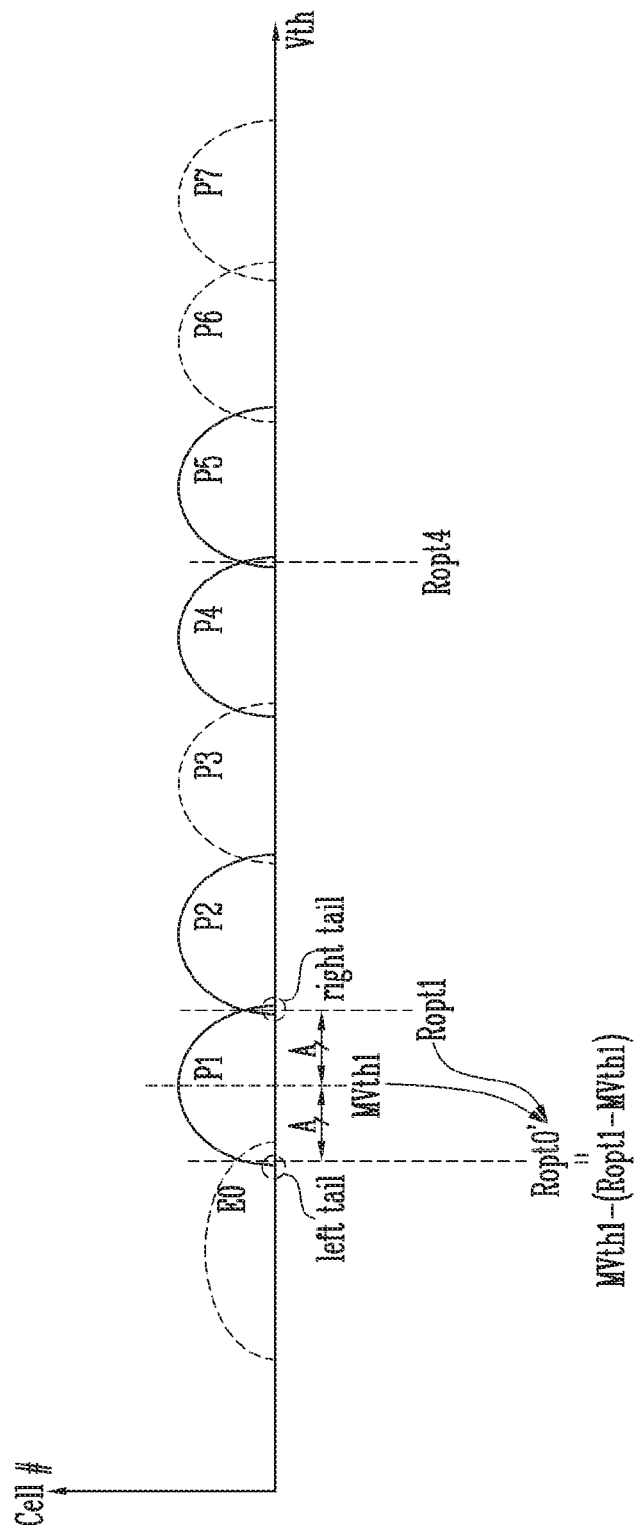
FIG. 8 is an example diagram illustrating a method of estimating an optimal read voltage based on an embodiment of the disclosed technology.

FIG. 8 is an example diagram illustrating a method of estimating an optimal read voltage based on an embodiment of the disclosed technology.

As shown in FIG. 8, a second read operation is performed with respect to programmed states P1, P2, P4, and P5 to determine or estimate optimal read voltages Ropt0' and Ropt4 to be used to read MSB data. Based on read data corresponding to the second read operation, the threshold voltage distributions of memory cells, which change with the changes in the channel characteristics, may be checked. For example, as illustrated in FIG. 8, threshold voltage distributions corresponding to the programmed states P1, P2, P4, and P5 may be checked.

When the threshold voltage distributions corresponding to the programmed states P1, P2, P4, and P5 are checked, the optimal read voltages Ropt0', Ropt1, and Ropt4 may be determined or estimated.

For example, the optimal read voltage Popt1 for distinguishing adjacent programmed states P1 and P2 from each other and the optimal read voltage Ropt4 for distinguishing the adjacent programmed states P4 and P5 from each other may be determined through a valley search operation.

The optimal read voltage between an erased state E0 and the programmed state P1 may be estimated using information in which channel characteristics are reflected. Since the threshold voltage distributions corresponding to the programmed states P1, P2, P4, and P5, illustrated in FIG. 8, and the optimal read voltages Ropt1 and Ropt4 are checked or determined after channel characteristics have changed, they may be regarded as information in which the channel characteristics are reflected. Therefore, when the optimal read voltage between the erased state E0 and the programmed state P1 is estimated using the information in which the channel characteristics are reflected, the accuracy of estimation may be improved.

Even if the channel characteristics are changed, assuming that each of threshold voltage distributions is maintained in a symmetric distribution or in a distribution that can be approximated to a symmetric distribution, the left tail and the right tail of the threshold voltage distribution corresponding to the programmed state P1 may be spaced apart from the average threshold voltage MVth1 corresponding to the programmed state P1 by the same distance. These characteristics may be used to estimate an optimal read voltage between the erased state E0 and the programmed state P1.

In an example, assuming that the threshold voltage distribution corresponding to the programmed state P1 has a symmetric shape or a symmetric-like shape (e.g., a distribution that can be approximated to a symmetric distribution), it may be considered that an interval A between the average threshold voltage MVth1 corresponding to the programmed state P1 and the optimal read voltage Ropt1 corresponding to the right tail of the programmed state P1 is equal to an interval A between the average threshold voltage MVth1 corresponding to the programmed state P1 and the optimal read voltage Ropt0' corresponding to the left tail of the programmed state P1. That is, the optimal read voltage Ropt0' may be estimated by the following Equation (2):

$$Ropt0' = MVth1 - (Ropt1 - MVth1) \qquad (2)$$

As shown in FIG. 8, by utilizing information reflecting channel characteristics, the accuracy of estimation may be further improved. Although the example illustrated in FIG. 8 is used to describe how the optimal read voltage between the erased state E0 and the programmed state P1 is estimated, the embodiments of the disclosed technology may also be applied to the estimation of optimal read voltages between programmed states (e.g., P1-P7).

In the following, it is assumed that an optimal read voltage for a certain program state (read voltage to determine whether a threshold voltage of a memory cell is in the certain program state or a higher threshold voltage level) is situated at the right tail and/or the left tail of a threshold voltage distribution corresponding to the certain program state.

In some embodiments of the disclosed technology, an optimal read voltage for a certain program state is situate in the right tail of a threshold voltage distribution corresponding to the certain program state.

For example, the optimal read voltage for the erased state E0 is situated between the threshold voltage distribution corresponding to the erased state E0 and the threshold voltage distribution corresponding to the programmed state P1.

In FIG. 8, it is assumed that each of the threshold voltage distributions has a symmetric shape or a symmetric-like shape. However, depending on the channel characteristics of memory cells, the threshold voltage distributions may have different shapes, and/or intervals between the threshold voltage distributions may be different from each other.

Depending on channel characteristics, an interval between an average threshold voltage corresponding to a predetermined threshold voltage distribution and an optimal read voltage corresponding to the right tail of the corresponding threshold voltage distribution and an interval between the average threshold voltage corresponding to the predetermined threshold voltage distribution and an optimal read voltage corresponding to the left tail of the corresponding threshold voltage distribution may vary and/or may be different from each other.

By reflecting channel characteristics, the accuracy of estimation may be further improved.

Figure 9:
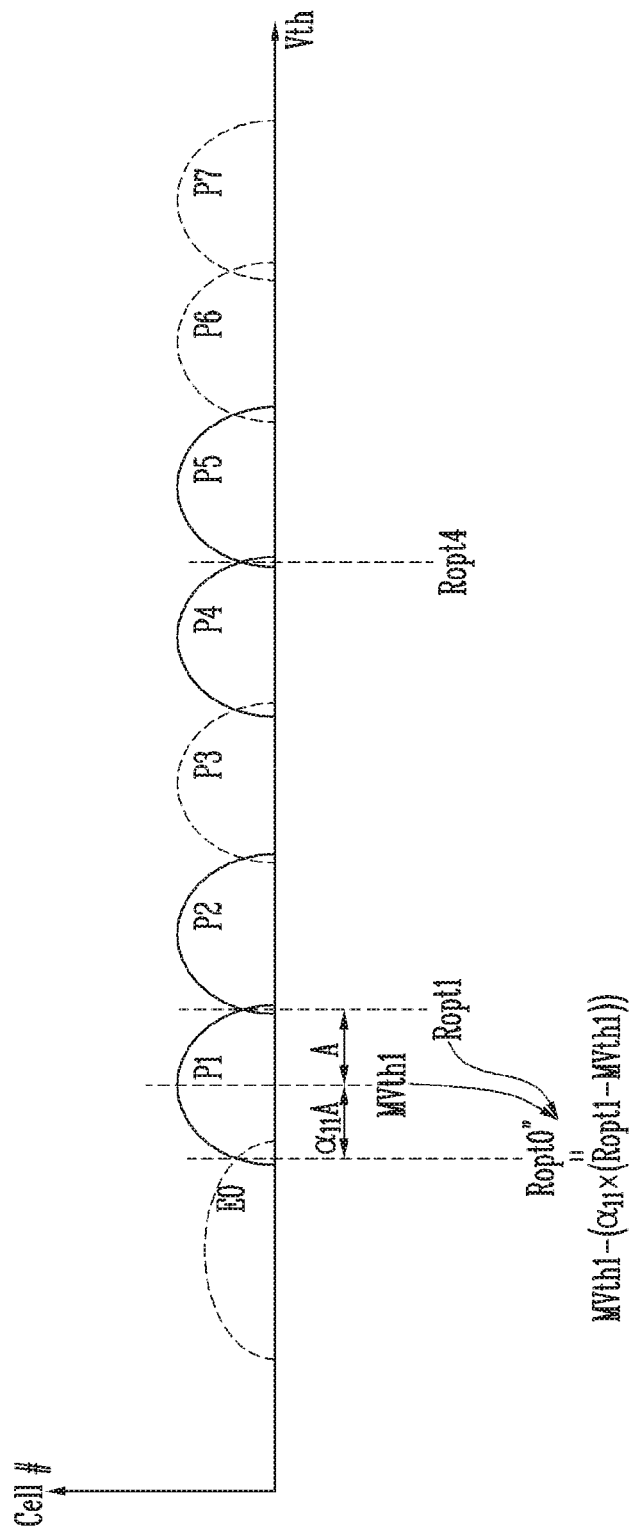
FIG. 9 is an example diagram illustrating a method of estimating an optimal read voltage based on an embodiment of the disclosed technology.

FIG. 9 is an example diagram illustrating a method of estimating an optimal read voltage based on an embodiment of the disclosed technology.

It is assumed that threshold voltage distributions corresponding to programmed states P1, P2, P4, and P5 are checked and where optimal read voltages Ropt1 and Ropt4 are determined.

Further, it is assumed that, even if channel characteristics are changed, each of threshold voltage distributions has a unimodal distribution shape or a distribution shape that can be approximated to a unimodal distribution.

An optimal read voltage Ropt0'' corresponding to an erased state E0 may be estimated using information reflecting channel characteristics. The information reflecting channel characteristics may include at least one of the threshold voltage distribution (or an average threshold voltage MVth1), the optimal read voltage Ropt1, or a weight $\alpha_{11}$ which correspond to a programmed state P1. As discussed with reference to FIG. 8, the threshold voltage distribution and the optimal read voltage Ropt1, which is situated in the right tail of the programmed state P1, are checked or determined after channel characteristics have changed, and thus they may be regarded as information reflecting the channel characteristics. The weight $\alpha_{11}$ may obtained through a device test operation that is previously conducted under the conditions corresponding to various channel characteristics. Therefore, the weight $\alpha_{11}$ may reflect channel characteristics in the optimal read voltage determination.

Assuming that each threshold voltage distribution has a unimodal distribution shape or a distribution shape that can be approximated to a unimodal distribution, it may be considered that a value, obtained by reflecting the weight an corresponding to channel characteristics in an interval A between the average threshold voltage MVth1 and the optimal read voltage Ropt1, is equal to an interval between the average threshold voltage MVth1 and the optimal read voltage Ropt0".

In an example, the optimal read voltage Ropt0" corresponding to the erased state E0 may be estimated by the following Equation (3):

$$Ropt0"=MVth1-(\alpha_{11}\times(Ropt1-MVth1)) \quad (3)$$

Since, in the embodiment described with reference to FIG. 9, weights corresponding to channel characteristics are further utilized, the accuracy of estimation may be further improved.

As illustrated in FIG. 9, the programmed states P1 and P2 are checked and the optimal read voltage Ropt1 is determined based on a valley search operation. In an embodiment, a preset value may be used as the optimal read voltage Ropt1. In this case, only a threshold voltage distribution corresponding to the programmed state P1 may be checked, and then an optimal read voltage Ropt0" may be estimated.

FIG. 10 is an example diagram for explaining a first weight table based on an embodiment of the disclosed technology.

The first weight table may include weights $\alpha_{11}$ to $\alpha_{64}$ depending on channel characteristics and programmed states P1 to P6. In FIG. 10, the weights $\alpha_{11}$ to $\alpha_{64}$ are predetermined based on both a program/erase cycle and a retention time as channel characteristics. However, embodiments of the disclosed technology are not limited thereto, and the weights $\alpha_{11}$ to $\alpha_{64}$ may be predetermined based on only channel characteristics corresponding to any one of a program/erase cycle and a retention time. Alternatively, the weights $\alpha_{11}$ to $\alpha_{64}$ may be predetermined based on causes of error other than the program/erase cycle and the retention time as channel characteristics.

Each of the weights $\alpha_{11}$ to $\alpha_{64}$ may indicate the ratio of an interval between an optimal read voltage corresponding to a first side of a threshold voltage distribution and the average threshold voltage of the threshold voltage distribution to an interval between an optimal read voltage corresponding to a second side of the threshold voltage distribution and the average threshold voltage of the threshold voltage distribution. For example, each of the weights $\alpha_{11}$, $\alpha_{12}$, $\alpha_{13}$, and $\alpha_{14}$ may indicate the ratio of an interval between an optimal read voltage corresponding to the programmed state P1 and the average threshold voltage corresponding to the programmed state P1 to an interval between an optimal read voltage corresponding to an erased state E0 and the average threshold voltage corresponding to the programmed state P1.

When the optimal read voltage is estimated, one of the weights may be selected from the first weight table depending on the channel characteristics of memory cells.

When the optimal read voltage corresponding to the programmed state P1 and the average threshold voltage corresponding to the programmed state P1 are known, a weight selected from among the weights $\alpha_{11}$, $\alpha_{12}$, $\alpha_{13}$, and $\alpha_{14}$ may be multiplied by the interval between the optimal read voltage corresponding to the programmed state P1 and the average threshold voltage corresponding to the programmed state P1, and in this way an interval between the optimal read voltage corresponding to the erased state E0 and the average threshold voltage corresponding to the programmed state P1 may be calculated. Further, the optimal read voltage corresponding to the erased state E0 may be estimated by subtracting the calculated interval from the average threshold voltage corresponding to the programmed state P1.

In contrast, when an optimal read voltage corresponding to the erased state E0 and the average threshold voltage corresponding to the programmed state P1 are known, the interval between the optimal read voltage corresponding to the programmed state P1 and the average threshold voltage corresponding to the programmed state P1 may be calculated by dividing the interval between the optimal read voltage corresponding to the erased state E0 and the average threshold voltage corresponding to the programmed state P1 by a weight selected from among the weights $\alpha_{11}$, $\alpha_{12}$, $\alpha_{13}$, and $\alpha_{14}$. Further, the optimal read voltage corresponding to the programmed state P1 may be estimated by adding the calculated interval to the average threshold voltage corresponding to the programmed state P1.

The weights $\alpha_{11}$ to $\alpha 64$ may be set at the step of testing a memory device. For example, at the test step, channel characteristics related to a program/erase cycle and a retention time may be tested, and the weights $\alpha_{11}$ to $\alpha_{64}$ may be preset depending on the result of the test.

Figure 11:
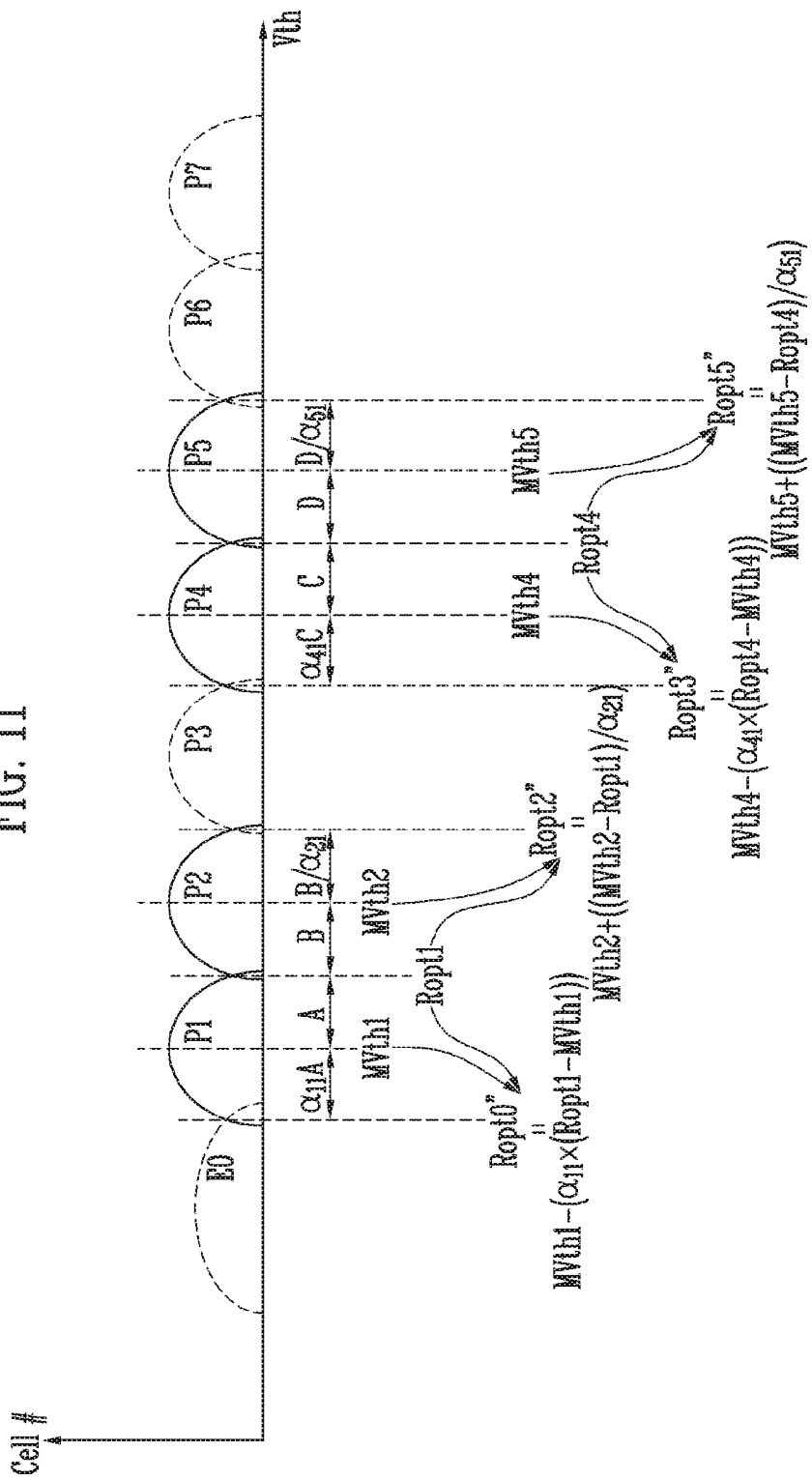
FIG. 11 is an example diagram illustrating a method of estimating an optimal read voltage based on an embodiment of the disclosed technology.

FIG. 11 is an example diagram illustrating a method of estimating an optimal read voltage based on an embodiment of the disclosed technology.

It is assumed that threshold voltage distributions corresponding to programmed states P1, P2, P4, and P5 are checked and where optimal read voltages Ropt1 and Ropt4 are determined and an optimal read voltage Ropt0" corresponding to an erased state E0 is estimated.

In the same or similar way to the estimation of the optimal read voltage Ropt0" corresponding to the erased state E0, the estimation of optimal read voltages Ropt2", Ropt3", and Ropt5" corresponding to programmed states P2, P3, and P5 may be performed.

For example, it may be considered that a value, obtained by reflecting a weight $\alpha_{21}$ in an interval B between an average threshold voltage MVth2 corresponding to the programmed state P2 and an optimal read voltage Ropt1 corresponding to the programmed state P1, is equal to an interval between the average threshold voltage MVth2 corresponding to the programmed state P2 and the optimal read voltage Ropt2" corresponding to the programmed state P2.

In an example, the optimal read voltage Ropt2" corresponding to the programmed state P2 may be estimated by the following Equation (4):

$$Ropt2"=MVth2+((MVth2-Ropt1)/\alpha_{21}) \quad (4)$$

Based on the same principle, an optimal read voltage Ropt3" corresponding to the programmed state P3 and an optimal read voltage Ropt5" corresponding to the programmed state P5 may be estimated.

For example, the optimal read voltage Ropt3" corresponding to the programmed state P3 and the optimal read voltage Ropt5″ corresponding to the programmed state P5 may be estimated using the following Equation (5):

$$Ropt3''=MVth4-(\alpha_{41}\times(Ropt4-MVth4))$$

$$Ropt5''=MVth5+((MVth5-Ropt4)/\alpha_{51}) \quad (5)$$

Equations (4) and (5) are only examples, and optimal read voltages may be estimated depending on various methods.

Figure 12:
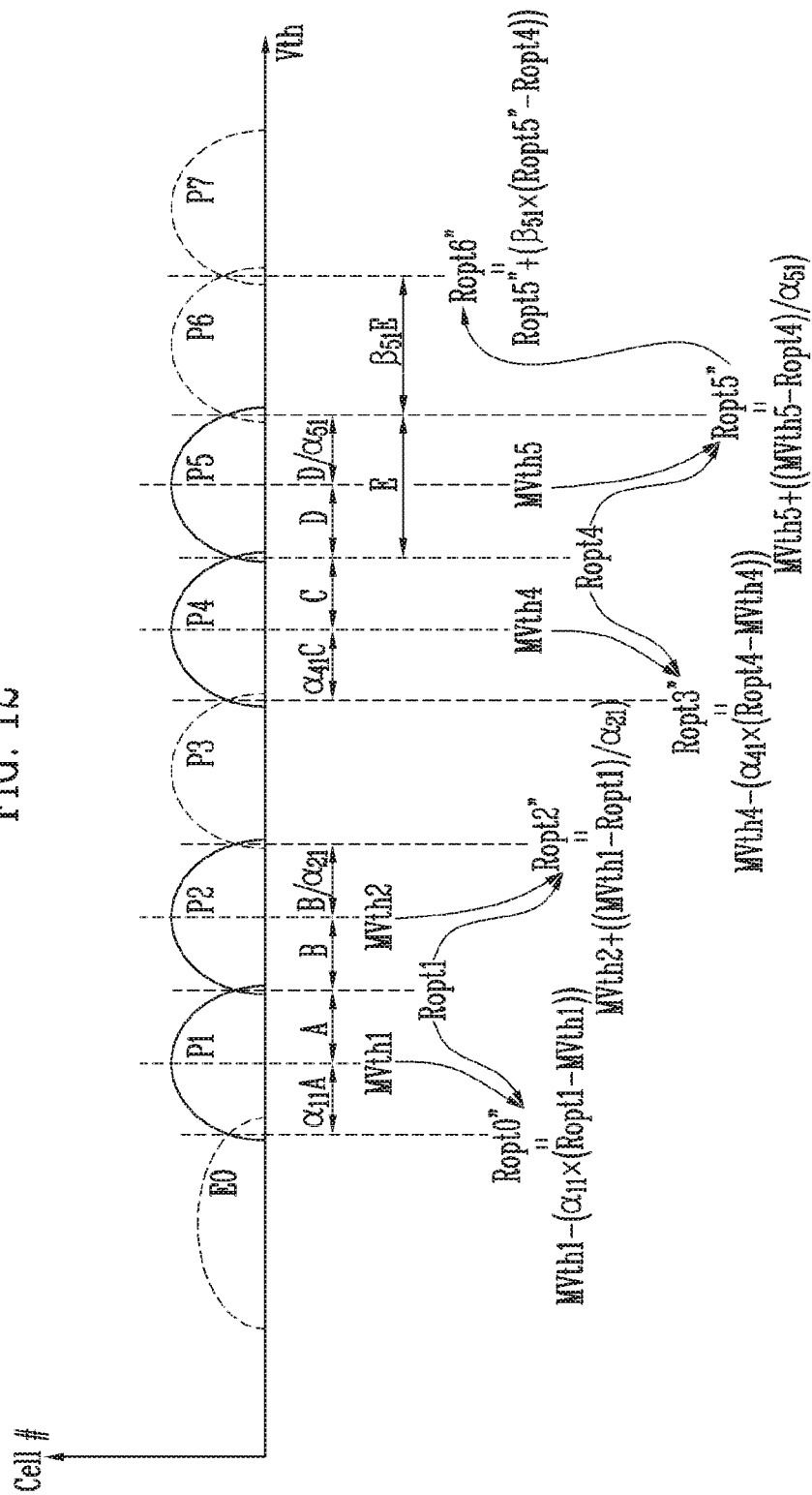
FIG. 12 is an example diagram illustrating a method of estimating an optimal read voltage based on an embodiment of the disclosed technology.

FIG. 12 is an example diagram illustrating a method of estimating an optimal read voltage based on an embodiment of the disclosed technology.

The threshold voltage distributions corresponding to programmed states P1, P2, P4, and P5 are checked and where optimal read voltages Ropt1 and Ropt4 are determined and optimal read voltages Ropt0″, Ropt2″, Ropt3″, and Ropt5″ are estimated in the same or similar way to the embodiment described with reference to FIG. 11.

An optimal read voltage Ropt6″ corresponding to a programmed state P6 may be estimated using information reflecting channel characteristics. The information reflecting channel characteristics may include optimal read voltages Ropt4 and Ropt6″ and a weight $\beta_{51}$. Since the optimal read voltages Ropt4 and Ropt6″ are checked or determined after channel characteristics have changed, they may be regarded as information reflecting the channel characteristics. The weight $\beta_{51}$ may be information obtained through a device test operation that is previously conducted under the conditions corresponding to various channel characteristics. Therefore, the weight $\beta_{51}$ may reflect channel characteristics.

For example, it may be considered that a value, obtained by reflecting a weight $\beta_{51}$ corresponding to the channel characteristics in an interval E between the optimal read voltage Ropt5″ and the optimal read voltage Ropt4, is equal to an interval between the optimal read voltage Ropt5″ and the optimal read voltage Ropt6″.

In an example, the optimal read voltage Ropt6″ corresponding to the programmed state P6 may be estimated using the following Equation (6):

$$Ropt6''=Ropt5''+(\beta_{51}\times(Ropt5''-Ropt4)) \quad (6)$$

In the embodiment described above with reference to FIG. 12, optimal read voltages between all states may be checked or estimated by checking only threshold voltage distributions corresponding to the programmed states P1, P2, P4, and P5. Therefore, the number of iterations of read operations that are performed to determine or estimate optimal read voltages may be reduced.

FIG. 13 is an example diagram for explaining a second weight table based on an embodiment of the disclosed technology.

The second weight table may include weights $\beta_{11}$ to $\beta_{54}$ depending on channel characteristics and programmed states P1 to P6. In FIG. 13, an example in which both a program/erase cycle and a retention time are taken into consideration as channel characteristics and in which the weights $\beta_{11}$ to $\beta_{54}$ are preset is illustrated as an example. However, embodiments of the disclosed technology are not limited thereto, and the weights $\beta_{11}$ to $\beta_{54}$ may be preset in consideration of only channel characteristics corresponding to any one of a program/erase cycle and a retention time. Alternatively, the weights $\beta_{11}$ to $\beta_{54}$ may be preset in consideration of various components other than the program/erase cycle and the retention time as channel characteristics.

Each of the weights $\beta_{11}$ to $\beta_{54}$ may indicate the ratio of distribution widths between threshold voltage distributions adjacent to each other. For example, the weights $\beta_{51}$, $\beta_{52}$, $\beta_{53}$, and $\beta_{54}$ may indicate the ratio of the width of a threshold voltage distribution corresponding to the programmed state P5 to the width of a threshold voltage distribution corresponding to the programmed state P6. The width of each threshold voltage distribution may indicate the difference value between an optimal read voltage corresponding to the left tail of the threshold voltage distribution and an optimal read voltage corresponding to the right tail of the threshold voltage distribution.

When the optimal read voltage is estimated, any one weight may be selected from the second weight table depending on the channel characteristics of memory cells.

When the width of the threshold voltage distribution corresponding to the programmed state P5 is known, the width of the threshold voltage distribution corresponding to the programmed state P6 may be calculated by multiplying a weight selected from among the weights $\beta_{51}$, $\beta_{52}$, $\beta_{53}$, and $\beta_{54}$ by the width of the threshold voltage distribution corresponding to the programmed state P5. Further, the optimal read voltage corresponding to the programmed state P6 may be estimated by adding the calculated width to the optimal read voltage corresponding to the programmed state P5.

In contrast, when the width of the threshold voltage distribution corresponding to the programmed state P6 is known, the width of the threshold voltage distribution corresponding to the programmed state P5 may be calculated by dividing the width of the threshold voltage distribution corresponding to the programmed state P6 by a weight selected from among the weights $\beta_{51}$, $\beta_{52}$, $\beta_{53}$, and $\beta_{54}$. Further, the optimal read voltage corresponding to the programmed state P5 may be estimated by subtracting the calculated width from the optimal read voltage corresponding to the programmed state P6.

The weights $\beta_{11}$ to $\beta_{54}$ may be preset at the step of testing a memory device. For example, at the test step, channel characteristics related to a program/erase cycle and a retention time may be tested, and the weights $\beta_{11}$ to $\beta_{54}$ may be preset depending on the results of the test.

Figure 14:
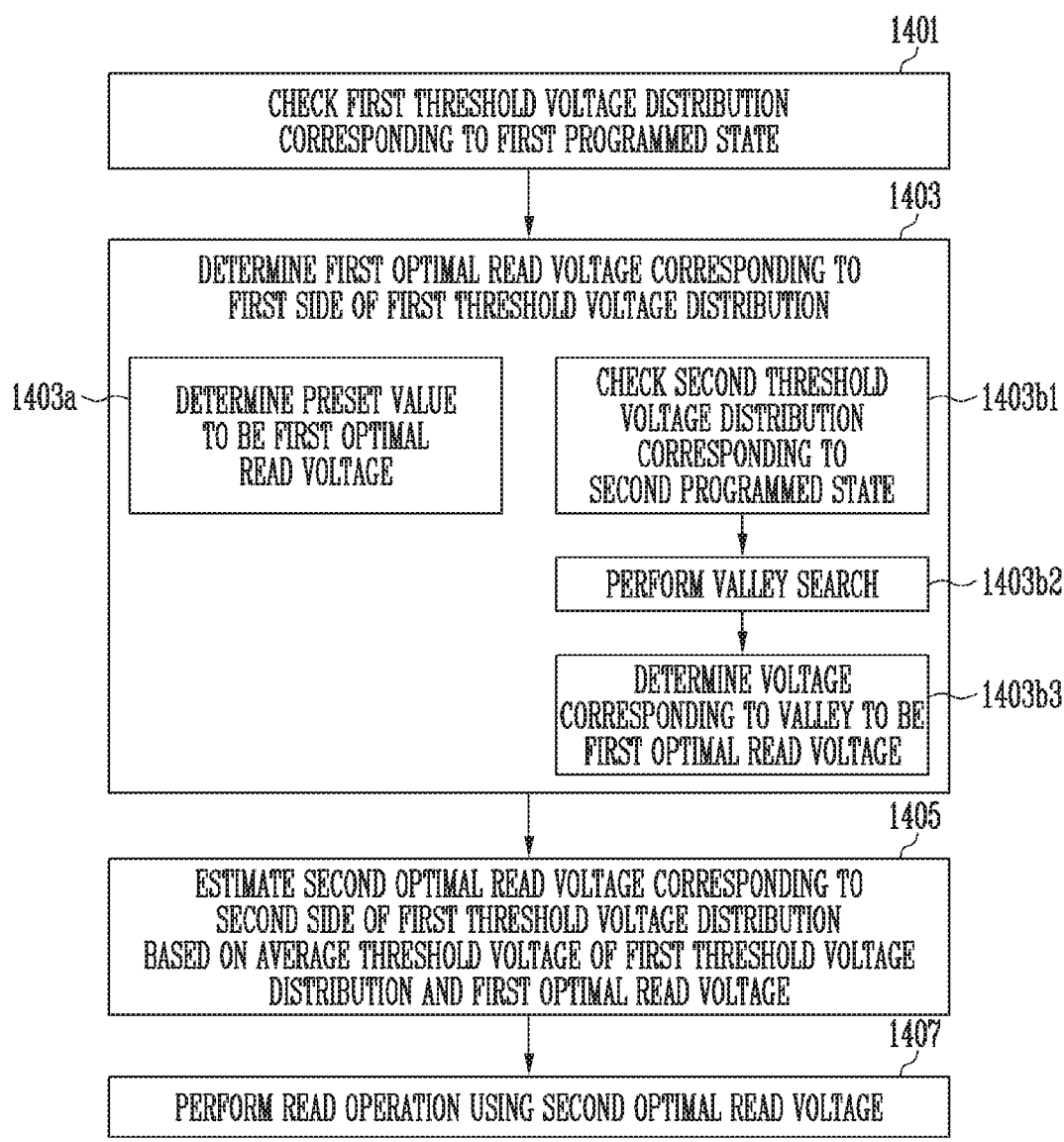
FIG. 14 is a flowchart illustrating a method of operating a memory controller based on an embodiment of the disclosed technology.

FIG. 14 is a flowchart illustrating a method of operating a memory controller based on an embodiment of the disclosed technology.

At step 1401, the memory controller may check a first threshold voltage distribution corresponding to a first programmed state. For example, the memory controller may check a threshold voltage distribution corresponding to one of a plurality of programmed states which memory cells can have. The memory controller may determine the average threshold voltage of the checked threshold voltage distribution.

At step 1403, the memory controller may determine a first optimal read voltage corresponding to a first side of the first threshold voltage distribution. At step 1403, step 1403a may be performed or, alternatively, steps 1403b1, 1403b2, and 1403b3 may be performed.

At step 1403a, the memory controller may select one of preset values, and may determine the selected value to be the first optimal read voltage.

At step 1403b1, the memory controller may check a second threshold voltage distribution corresponding to a second programmed state. The second programmed state may be a programmed state adjacent to the first programmed state.

At step 1403b2, the memory controller may search for a valley by performing a valley search operation based on the threshold voltage distribution corresponding to the first programmed state and the threshold voltage distribution corresponding to the second programmed state.

At step 1403b3, the memory controller may determine the first optimal read voltage based on a voltage corresponding to the found valley. For example, the memory controller may select a voltage corresponding to the found valley as the first optimal read voltage.

At step 1405, the memory controller may estimate a second optimal read voltage corresponding to a second side of the first threshold voltage distribution based on the average threshold voltage of the first threshold voltage distribution and the first optimal read voltage.

In an embodiment, the memory controller may estimate the second optimal read voltage so that the difference value between the average threshold voltage of the first threshold voltage distribution and the first optimal read voltage is equal to the difference value between the average threshold voltage of the first threshold voltage distribution and the second optimal read voltage.

In an embodiment, the memory controller may estimate the second optimal read voltage so that a value, obtained by reflecting a first weight corresponding to channel characteristics of memory cells in the difference value between the average threshold voltage of the first threshold voltage distribution and the first optimal read voltage, is equal to the difference value between the average threshold voltage of the first threshold voltage distribution and the second optimal read voltage.

At step 1405, the memory controller may further estimate an optimal read voltage between threshold voltage distributions disposed on a second side of the first threshold voltage distribution based on the first optimal read voltage and the second optimal read voltage. For example, the memory controller may estimate the optimal read voltage between threshold voltage distributions disposed on the second side of the first threshold voltage distribution based on a value obtained by reflecting a second weight corresponding to the channel characteristics of the memory cells in the difference value between the first optimal read voltage and the second optimal read voltage.

At step 1407, the memory controller may perform a read operation on the memory cells using the second optimal read voltage. At step 1405, when the optimal read voltage between threshold voltage distributions disposed on the second side of the first threshold voltage distribution is further estimated, a read operation using the estimated optimal read voltage may be further performed.

Figure 15:
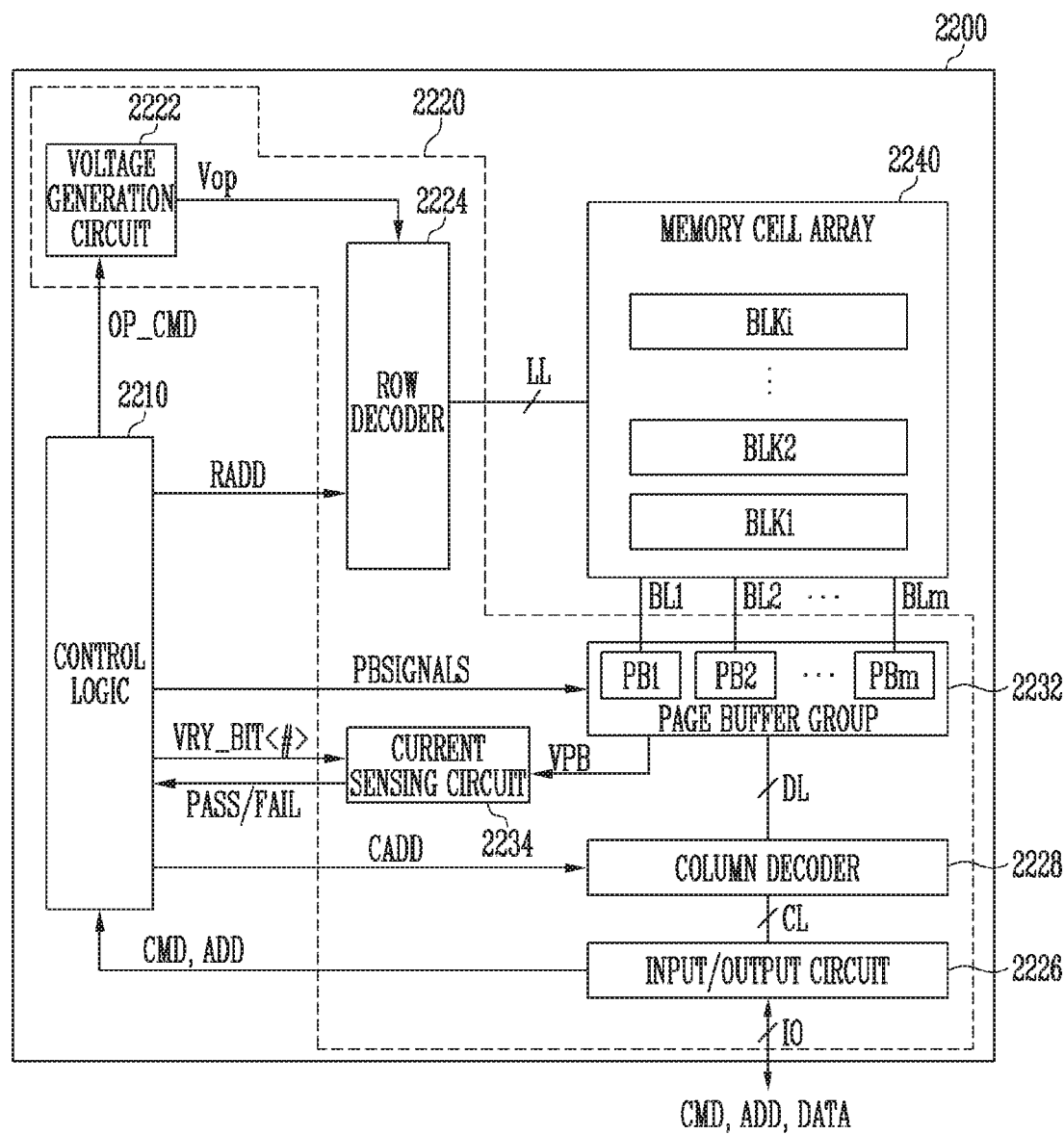
FIG. 15 is a diagram illustrating a memory device based on an embodiment of the disclosed technology.

FIG. 15 is a diagram illustrating a memory device based on an embodiment of the disclosed technology. The memory device illustrated in FIG. 15 may be applied to the memory system illustrated in FIGS. 1 to 4.

The memory device 2200 may include a control logic 2210, peripheral circuits 2220 and a memory cell array 2240. The peripheral circuits 2220 may include a voltage generation circuit 2222, a row decoder 2224, an input/output circuit 2226, a column decoder 2228, a page buffer group 2232, and a current sensing circuit 2234.

The control logic 2210 may control the peripheral circuits 2220 under the control of the memory controller 2100 illustrated in FIGS. 1 to 4.

The control logic 2210 may control the peripheral circuits 2220 in response to a command CMD and an address ADD that are received from the memory controller 2100 through the input/output circuit 2226. For example, the control logic 2210 may output an operation signal OP_CMD, a row address RADD, a column address CADD, page buffer control signals PBSIGNALS, and an enable bit VRY_BIT<#> in response to the command CMD and the address ADD. The control logic 2210 may determine whether a verify operation has passed or failed in response to a pass or fail signal PASS or FAIL received from the current sensing circuit 2234.

The peripheral circuits 2220 may perform a program operation of storing data in the memory cell array 2240, a read operation of outputting data stored in the memory cell array 2240, and an erase operation of erasing data stored in the memory cell array 2240.

The voltage generation circuit 2222 may generate various operating voltages Vop that are used for the program, read, and erase operations in response to the operation signal OP_CMD received from the control logic 2210. For example, the voltage generation circuit 2222 may transfer a program voltage, a verify voltage, a pass voltage, a read voltage, an erase voltage, a turn-on voltage, etc. to the row decoder 2224.

The row decoder 2224 may transfer the operating voltages Vop to local lines LL that are coupled to a memory block selected from among memory blocks included in the memory cell array 2240 in response to the row address RADD received from the control logic 2210. The local lines LL may include local word lines, local drain select lines, and local source select lines. In addition, the local lines LL may include various lines, such as source lines, coupled to memory blocks.

The input/output circuit 2226 may transfer the command CMD and the address ADD, received from the memory controller through input/output (IO) lines, to the control logic 2210, or may exchange data with the column decoder 2228.

The column decoder 2228 may transfer data between the input/output circuit 2226 and the page buffer group 2232 in response to a column address CADD received from the control logic 2210. For example, the column decoder 2228 may exchange data with page buffers PB1 to PBm through data lines DL or may exchange data with the input/output circuit 2226 through column lines CL.

The page buffer group 2232 may be coupled to bit lines BL1 to BLm coupled in common to the memory blocks BLK1 to BLKi. The page buffer group 2232 may include a plurality of page buffers PB1 to PBm coupled to the bit lines BL1 to BLm, respectively. For example, one page buffer may be coupled to each bit line. The page buffers PB1 to PBm may be operated in response to the page buffer control signals PBSIGNALS received from the control logic 2210. For example, during a program operation, the page buffers PB1 to PBm may temporarily store program data received from the memory controller, and may control voltages to be applied to the bit lines BL1 to BLm based on the program data. Also, during a read operation, the page buffers PB1 to PBm may temporarily store data received through the bit lines BL1 to BLm or may sense voltages or currents of the bit lines BL1 to BLm.

During a read operation or a verify operation, the current sensing circuit 2234 may generate a reference current in response to the enable bit VRY_BIT<#> received from the control logic 2210, and may compare a reference voltage, generated by the reference current, with a sensing voltage VPB, received from the page buffer group 2232, and then output a pass signal PASS or a fail signal FAIL.

The memory cell array 2240 may include a plurality of memory blocks BLK1 to BLKi in which data is stored. In the memory blocks BLK1 to BLKi, user data and various types of information required for the operation of the memory device 2200 may be stored. The memory blocks BLK1 to BLKi may each be implemented as a two-dimensional (2D) structure or a three-dimensional (3D) structure, and may be equally configured.

Figure 16:
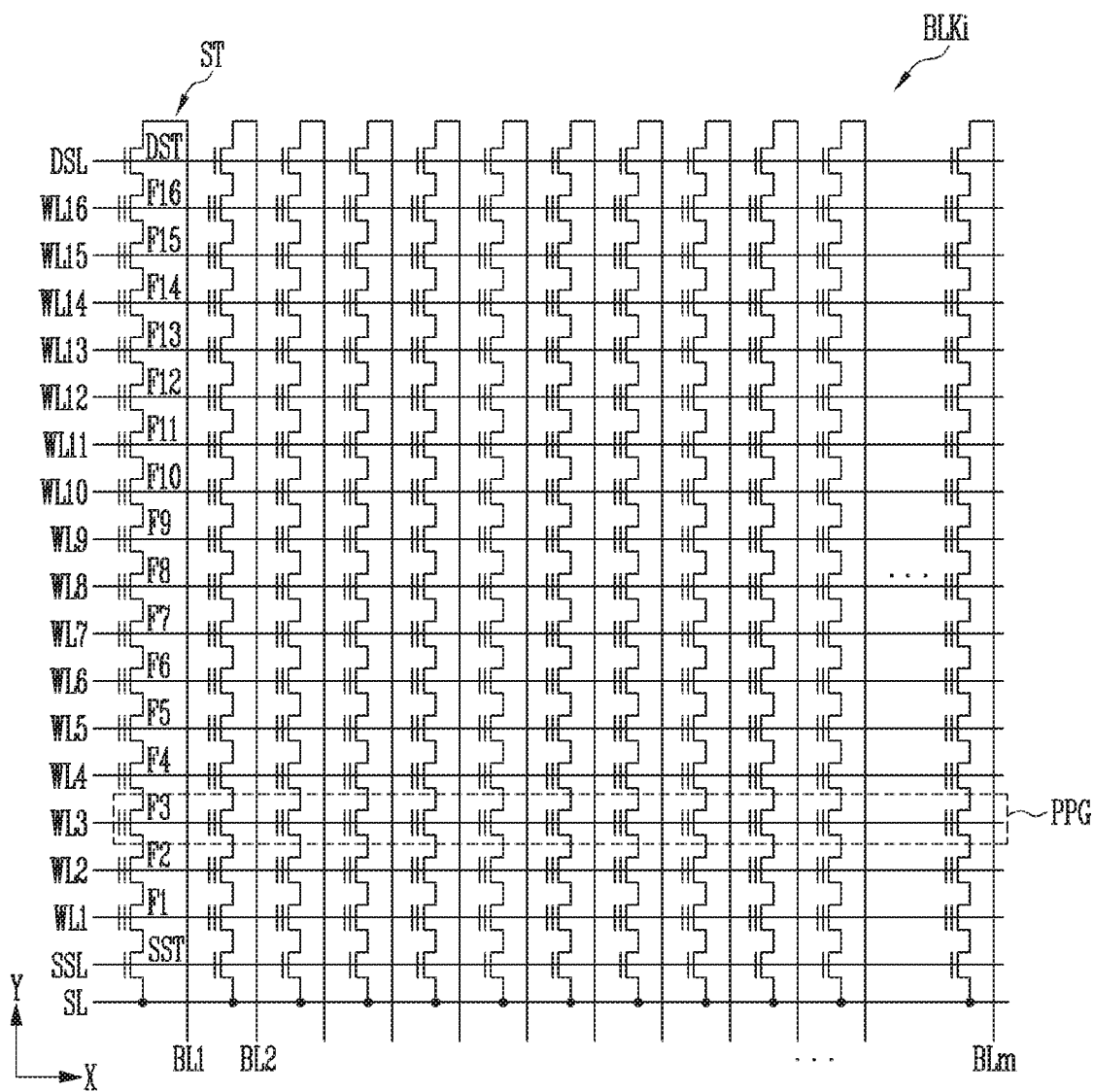
FIG. 16 is an example diagram illustrating a memory block.

FIG. 16 is a diagram illustrating a memory block.

A memory cell array may include a plurality of memory blocks, and any one memory block BLKi of the plurality of memory blocks is illustrated in FIG. 16 for convenience of description.

A plurality of word lines arranged in parallel to each other between a first select line and a second select line may be coupled to the memory block BLKi. Here, the first select line may be a source select line SSL, and the second select line may be a drain select line DSL. In detail, the memory block BLKi may include a plurality of strings ST coupled between bit lines BL1 to BLm and a source line SL. The bit lines BL1 to BLm may be coupled to the strings ST, respectively, and the source line SL may be coupled in common to the strings ST. The strings ST may be equally configured, and thus the string ST coupled to the first bit line BL1 will be described in detail by way of example.

The string ST may include a source select transistor SST, a plurality of memory cells F1 to F16, and a drain select transistor DST which are coupled in series to each other between the source line SL and the first bit line BL1. A single string ST may include at least one source select transistor SST and at least one drain select transistor DST, and more memory cells than the memory cells F1 to F16 illustrated in the drawing may be included in the string ST.

A source of the source select transistor SST may be coupled to the source line SL, and a drain of the drain select transistor DST may be coupled to the first bit line BL1. The memory cells F1 to F16 may be coupled in series between the source select transistor SST and the drain select transistor DST. Gates of the source select transistors SST included in different strings ST may be coupled to the source select line SSL, gates of the drain select transistors DST included in different strings ST may be coupled to the drain select line DSL, and gates of the memory cells F1 to F16 may be coupled to a plurality of word lines WL1 to WL16, respectively. A group of memory cells coupled to the same word line, among the memory cells included in different strings ST, may be referred to as a "physical page: PPG". Therefore, the memory block BLKi may include a number of physical pages PPG identical to the number of word lines WL1 to WL16.

Figure 17:
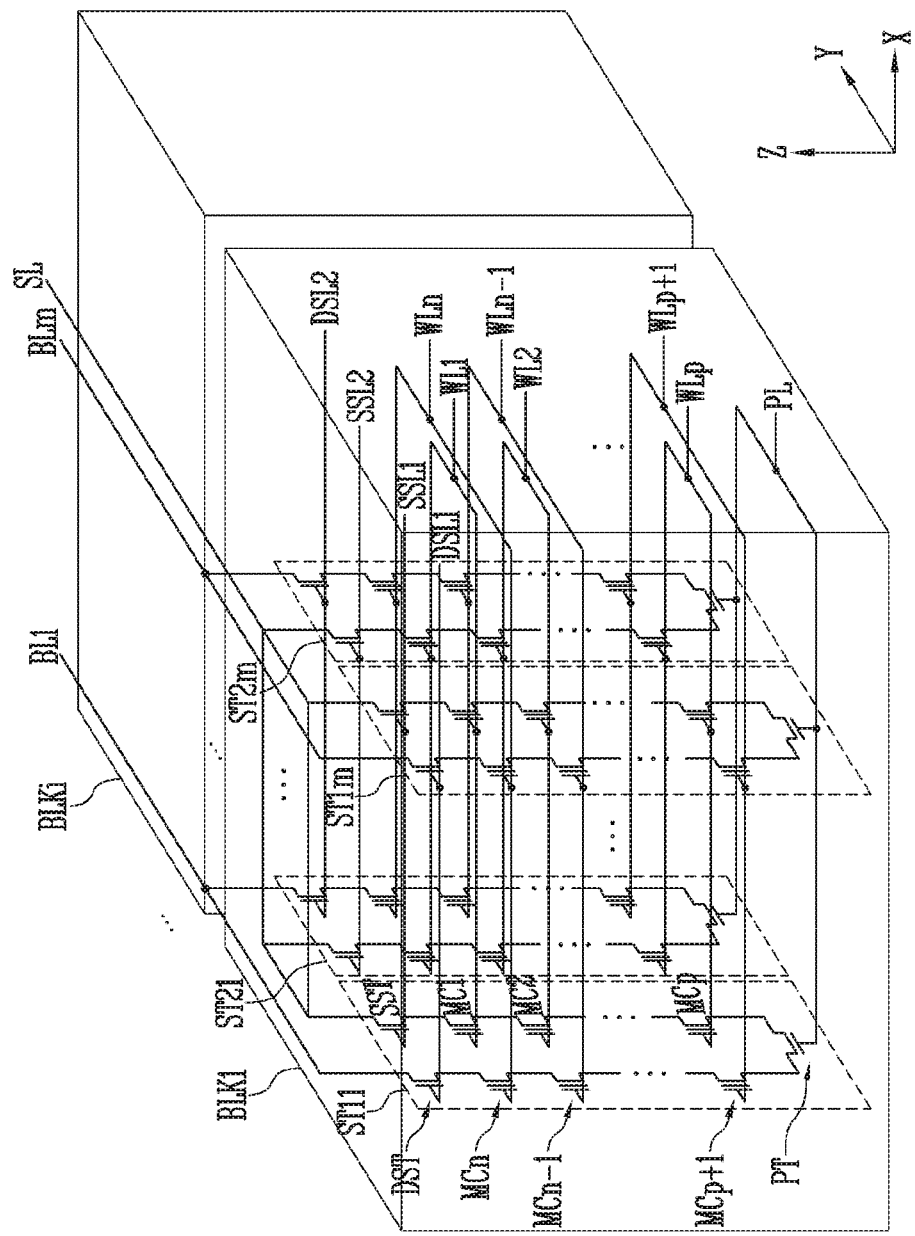
FIG. 17 is a diagram illustrating an example of a memory block having a 3D structure.

FIG. 17 is a diagram illustrating an example of a memory block having a 3D structure.

A memory cell array 2240 may include a plurality of memory blocks BLK1 to BLKi. When the first memory block BLK1 is described by way of example, the first memory block BLK1 may include a plurality of strings ST11 to ST1*m* and ST21 to ST2*m*. In an embodiment, each of the strings ST11 to ST1*m* and ST21 to ST2*m* may be formed in a 'U' shape. In the first memory block BLK1, m strings may be arranged in a row direction (e.g., X direction). Although, in FIG. 17, two strings are illustrated as being arranged in a column direction (e.g., Y direction), this embodiment is given for convenience of description, and three or more strings may be arranged in the column direction (e.g., Y direction) in other embodiments.

Each of the plurality of strings ST11 to ST1*m* and ST21 to ST2*m* may include at least one source select transistor SST, first to n-th memory cells MC1 to MCn, a pipe transistor PT, and at least one drain select transistor DST.

The source and drain select transistors SST and DST and the memory cells MC1 to MCn may have a similar structure. For example, each of the source and drain select transistors SST and DST and the memory cells MC1 to MCn may include a channel layer, a tunnel insulating layer, a charge trap layer, and a blocking insulating layer. For example, a pillar for providing the channel layer may be provided in each string. For example, a pillar for providing at least one of the channel layer, the tunnel insulating layer, the charge trap layer, or the blocking insulating layer may be provided in each string.

The source select transistor SST of each string may be coupled between a source line SL and memory cells MC1 to MCp.

In an embodiment, source select transistors of strings arranged in the same row may be coupled to a source select line extending in the row direction, and source select transistors of strings arranged in different rows may be coupled to different source select lines. In FIG. 17, the source select transistors of the strings ST11 to ST1*m* in a first row may be coupled to a first source select line SSL1. The source select transistors of the strings ST21 to ST2*m* in a second row may be coupled to a second source select line SSL2.

In other embodiments, the source select transistors of the strings ST11 to ST1*m* and ST21 to ST2*m* may be coupled in common to one source select line.

The first to n-th memory cells MC1 to MCn in each string may be coupled between the source select transistor SST and the drain select transistor DST.

The first to n-th memory cells MC1 to MCn may be divided into first to p-th memory cells MC1 to MCp and p+1-th to n-th memory cells MCp+1 to MCn. The first to p-th memory cells MC1 to MCp may be sequentially arranged in a vertical direction (e.g., Z direction), and may be coupled in series between the source select transistor SST and the pipe transistor PT. The p+1-th to n-th memory cells MCp+1 to MCn may be sequentially arranged in the vertical direction (e.g., Z direction), and may be coupled in series between the pipe transistor PT and the drain select transistor DST. The first to p-th memory cells MC1 to MCp and the p+1-th to n-th memory cells MCp+1 to MCn may be coupled to each other through the pipe transistor PT. Gates of the first to n-th memory cells MC1 to MCn in each string may be coupled to first to n-th word lines WL1 to WLn, respectively.

In an embodiment, at least one of the first to n-th memory cells MC1 to MCn may be used as a dummy memory cell. When the dummy memory cell is provided, the voltage or current of the corresponding string may be stably controlled. A gate of the pipe transistor PT of each string may be coupled to a pipeline PL.

The drain select transistor DST of each string may be coupled between the corresponding bit line and the memory cells MCp+1 to MCn. Strings arranged in the row direction may be coupled to the corresponding drain select line extending in the row direction. The drain select transistors of the strings ST11 to ST1*m* in the first row may be coupled to a drain select line DSL1. The drain select transistors of the strings ST21 to ST2*m* in the second row may be coupled to a second drain select line DSL2.

The strings arranged in the column direction may be coupled to bit lines extending in the column direction. In FIG. 17, the strings ST11 and ST21 in a first column may be coupled to a first bit line BL1. The strings ST1*m* and ST2*m* in an m-th column may be coupled to an m-th bit line BLm.

Among strings arranged in the row direction, memory cells coupled to the same word line may constitute one page. For example, memory cells coupled to the first word line WL1, among the strings ST11 to ST1*m* in the first row, may constitute one page. Among the strings ST21 to ST2*m* in the second row, memory cells coupled to the first word line WL1 may constitute one additional page. Strings arranged in the direction of one row may be selected by selecting any one of the drain select lines DSL1 and DSL2. One page may be selected from the selected strings by selecting any one of the word lines WL1 to WLn.

Figure 18:
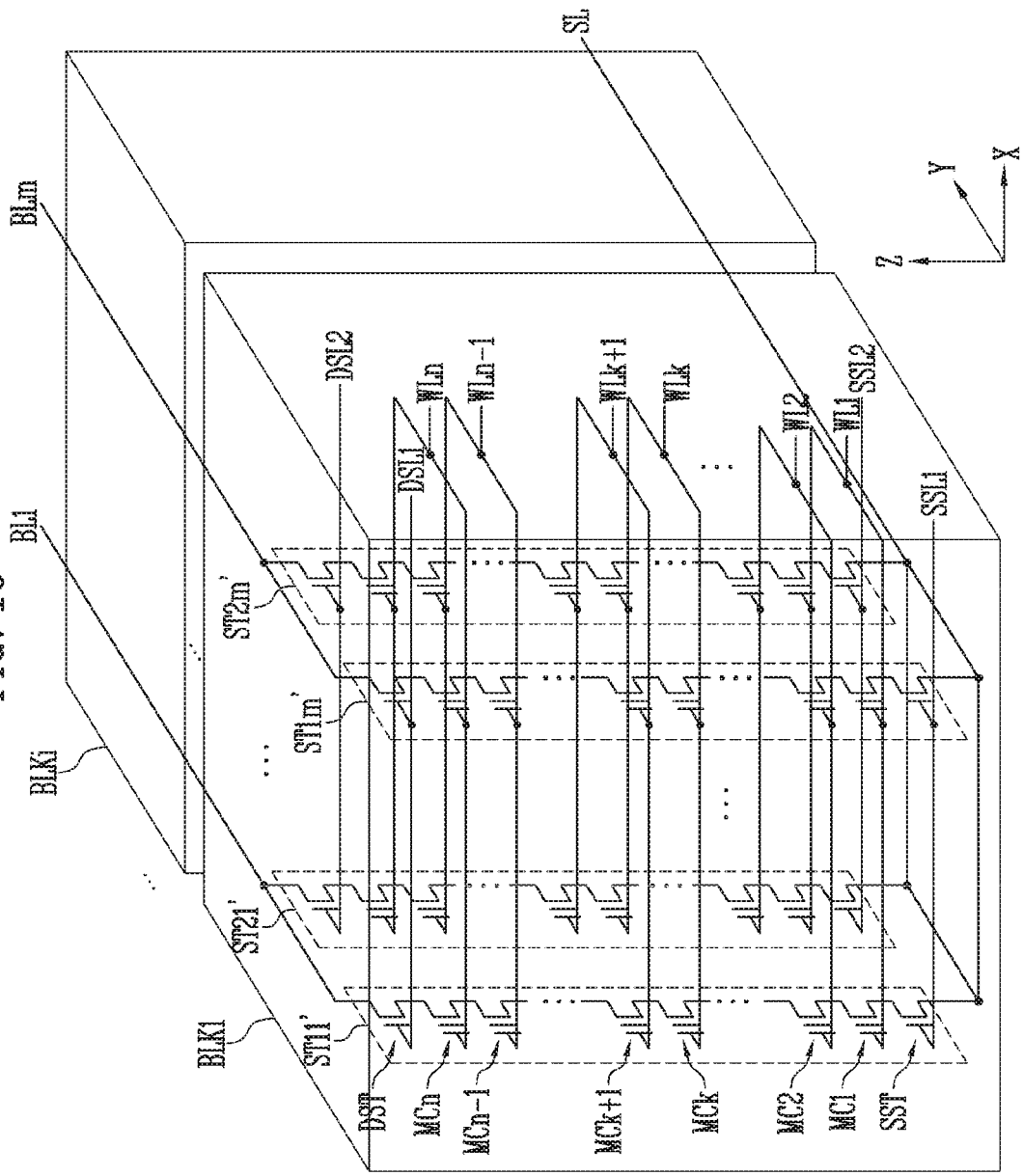
FIG. 18 is a diagram illustrating an example of a memory block having a 3D structure.

FIG. 18 is a diagram illustrating an example of a memory block having a 3D structure.

A memory cell array 2240 includes a plurality of memory blocks BLK1 to BLKi. When the first memory block BLK1 is described by way of example, the first memory block BLK1 may include a plurality of strings ST11' to ST1$m$' and ST21' to ST2$m$'. Each of the strings ST11' to ST1$m$' and ST21' to ST2$m$' may extend along a vertical direction (e.g., Z direction). In the memory block BLKi, m' strings may be arranged in a row direction (e.g., X direction). Although, in FIG. 18, two strings are illustrated as being arranged in a column direction (e.g., Y direction), this embodiment is given for convenience of description, and three or more strings may be arranged in the column direction (e.g., Y direction) in other embodiments.

Each of the strings ST11' to ST1$m$' and ST21' to ST2$m$' may include at least one source select transistor SST, first to n-th memory cells MC1 to MCn, and at least one drain select transistor DST.

The source select transistor SST of each string may be coupled between a source line SL and the memory cells MC1 to MCn. Source select transistors of strings arranged in the same row may be coupled to the same source select line. The source select transistors of the strings ST11' to ST1$m$' arranged in a first row may be coupled to a first source select line SSL1. The source select transistors of the strings ST21' to ST2$m$' arranged in a second row may be coupled to a second source select line SSL2. In an embodiment, the source select transistors of the strings ST11' to ST1$m$' and ST21' to ST2$m$' may be coupled in common to one source select line.

The first to n-th memory cells MC1 to MCn in each string may be coupled in series between the source select transistor SST and the drain select transistor DST. Gates of the first to n-th memory cells MC1 to MCn may be coupled to first to n-th word lines WL1 to WLn, respectively.

In an embodiment, at least one of the first to n-th memory cells MC1 to MCn may be used as a dummy memory cell. When the dummy memory cell is provided, the voltage or current of the corresponding string may be stably controlled. Thereby, the reliability of data stored in the first memory block BLK1 may be improved.

The drain select transistor DST of each string may be coupled between the corresponding bit line and the memory cells MC1 to MCn. The drain select transistors DST of strings arranged in the row direction may be coupled to a drain select line extending along the row direction. The drain select transistors DST of the strings ST11' to ST1$m$' in the first row may be coupled to a first drain select line DSL1. The drain select transistors DST of the strings ST21' to ST2$m$' in the second row may be coupled to a second drain select line DSL2.

That is, the first memory block BLK1 of FIG. 18 may have an equivalent circuit similar to that of the first memory block BLK1 of FIG. 17 except that a pipe transistor PT is excluded from each string.

Figure 19:
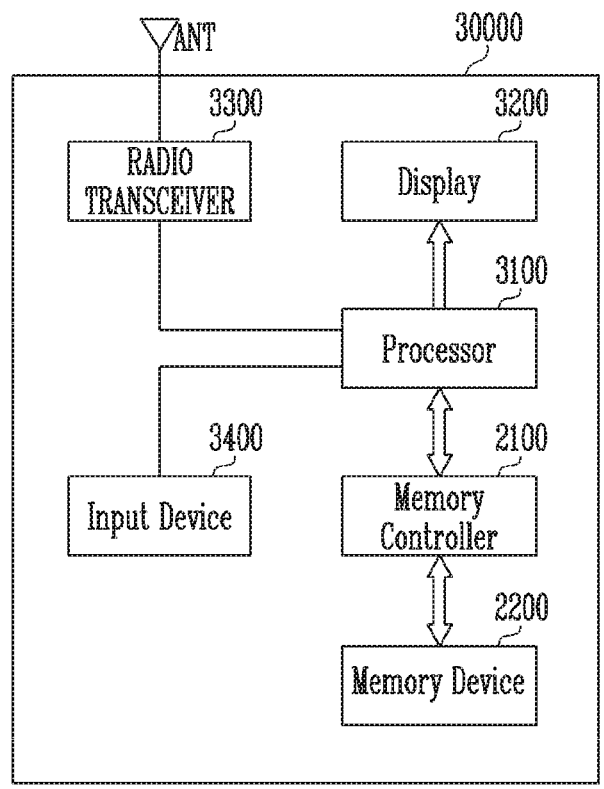
FIGS. 19 to 22 are diagrams illustrating examples of a memory system including the memory controller of FIGS. 1 to 4.

FIG. 19 is a diagram illustrating an example of a memory system including the memory controller of FIGS. 1 to 4.

A memory system 30000 may be implemented as a cellular phone, a smartphone, a tablet, a PC, a personal digital assistant (PDA) or a wireless communication device. The memory system 30000 may include a memory device 2200 and a memory controller 2100 that is capable of controlling the operation of the memory device 2200.

The memory controller 2100 may control a data access operation, e.g., a program, erase, or read operation, of the memory device 2200 under the control of a processor 3100.

Data programmed in the memory device 2200 may be output through a display 3200 under the control of the memory controller 2100.

A radio transceiver 3300 may send and receive radio signals through an antenna ANT. For example, the radio transceiver 3300 may change a radio signal received through the antenna ANT into a signal which may be processed by the processor 3100. Therefore, the processor 3100 may process a signal output from the radio transceiver 3300 and transmit the processed signal to the memory controller 2100 or the display 3200. The memory controller 2100 may transmit a signal processed by the processor 3100 to the memory device 2200. Furthermore, the radio transceiver 3300 may change a signal output from the processor 3100 into a radio signal, and output the changed radio signal to the external device through the antenna ANT. An input device 3400 may be used to input a control signal for controlling the operation of the processor 3100 or data to be processed by the processor 3100. The input device 3400 may be implemented as a pointing device such as a touch pad or a computer mouse, a keypad or a keyboard. The processor 3100 may control the operation of the display 3200 such that data output from the memory controller 2100, data output from the radio transceiver 3300, or data output from the input device 3400 is output through the display 3200.

In an embodiment, the memory controller 2100 capable of controlling the operation of the memory device 2200 may be implemented as a part of the processor 3100 or as a chip provided separately from the processor 3100.

Figure 20:
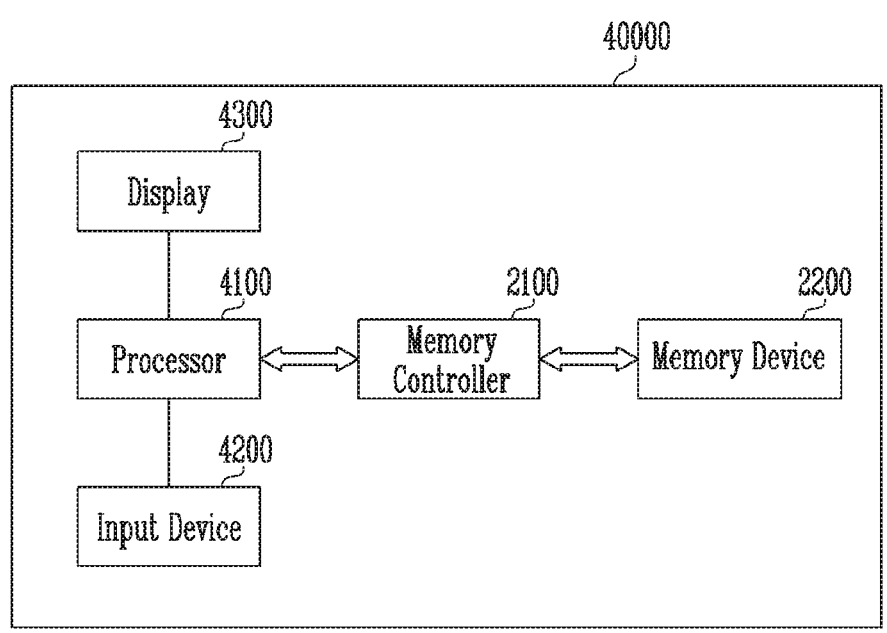

FIG. 20 is a diagram illustrating an example of a memory system including the memory controller of FIGS. 1 to 4.

A memory system 40000 may be embodied in a personal computer (PC), a tablet, a net-book, an e-reader, a personal digital assistant (PDA), a portable multimedia player (PMP), an MP3 player, or an MP4 player.

The memory system 40000 may include a memory device 2200 and a memory controller 2100 that is capable of controlling the data processing operation of the memory device 2200.

A processor 4100 may output data stored in the memory device 2200 through a display 4300, according to data input from an input device 4200. For example, the input device 4200 may be implemented as a point device such as a touch pad or a computer mouse, a keypad or a keyboard.

The processor 4100 may control the overall operation of the memory system 40000 and control the operation of the memory controller 2100. In an embodiment, the memory controller 2100 capable of controlling the operation of the memory device 2200 may be implemented as a part of the processor 4100 or as a chip provided separately from the processor 4100.

Figure 21:
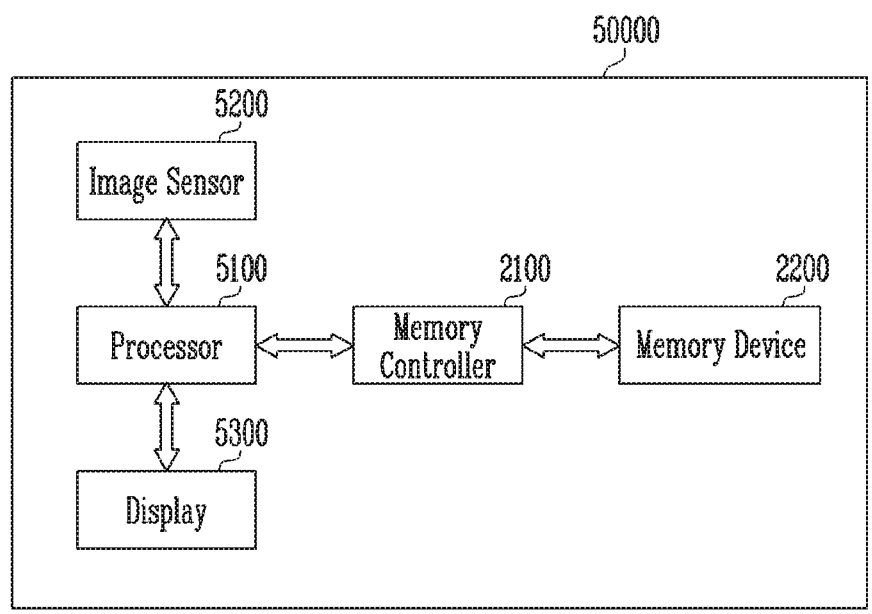

FIG. 21 is a diagram illustrating an example of a memory system including the memory controller of FIGS. 1 to 4.

A memory system 50000 may be embodied in an image processing device, e.g., a digital camera, a portable phone provided with a digital camera, a smartphone provided with a digital camera, or a tablet provided with a digital camera.

The memory system 50000 may include a memory device 2200 and a memory controller 2100 that is capable of controlling a data processing operation, e.g., a program, erase, or read operation, of the memory device 2200.

An image sensor 5200 of the memory system 50000 may convert an optical image into digital signals. The converted digital signals may be transmitted to a processor 5100 or the memory controller 2100. Under the control of the processor 5100, the converted digital signals may be output through a display 5300 or stored in the memory device 2200 through the memory controller 2100. Data stored in the memory device 2200 may be output through the display 5300 under the control of the processor 5100 or the memory controller 2100.

In an embodiment, the memory controller 2100 capable of controlling the operation of the memory device 2200 may be implemented as a part of the processor 5100, or as a chip provided separately from the processor 5100.

Figure 22:
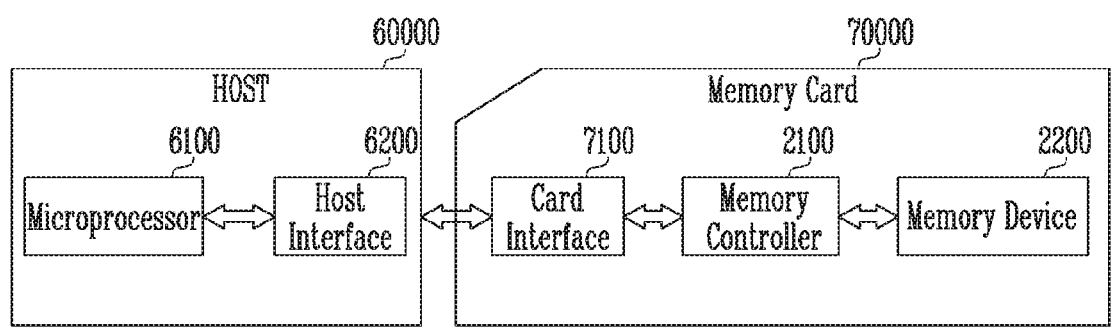

FIG. 22 is a diagram illustrating an example of a memory system including the memory controller of FIGS. 1 to 4.

A memory system 70000 may be embodied in a memory card or a smart card. The memory system 70000 may include a memory device 2200, a memory controller 2100, and a card interface 7100.

The memory controller 2100 may control data exchange between the memory device 2200 and the card interface 7100. In an embodiment, the card interface 7100 may be a secure digital (SD) card interface or a multi-media card (MMC) interface, but it is not limited thereto.

The card interface 7100 may interface data exchange between a host 60000 and the memory controller 2100 according to a protocol of the host 60000. In an embodiment, the card interface 7100 may support a universal serial bus (USB) protocol, and an interchip (IC)-USB protocol. Here, the card interface 7100 may refer to hardware capable of supporting a protocol which is used by the host 60000, software installed in the hardware, or a signal transmission method.

When the memory system 70000 is connected to a host interface 6200 of the host 60000 such as a PC, a tablet, a digital camera, a digital audio player, a cellular phone, console video game hardware or a digital set-top box, the host interface 6200 may perform data communication with the memory device 2200 through the card interface 7100 and the memory controller 2100 under the control of a microprocessor 6100.

In accordance with the disclosed technology, an optimal read voltage may be estimated by reflecting channel characteristics, and thus the accuracy of a read operation may be improved.

In some embodiments of the disclosed technology, the number of iterations of read operations performed on memory cells to estimate an optimal read voltage may be reduced.

While the exemplary embodiments of the disclosed technology have been disclosed for illustrative purposes, those skilled in the art will appreciate that various modifications, additions and substitutions are possible. Therefore, the scope of the disclosed technology must be defined by the appended claims and equivalents of the claims rather than by the description preceding them.

What is claimed is:

1. A memory system, comprising:
a memory device including memory cells, each having a state corresponding to any one of an erased state or one of a plurality of programmed states; and
a memory controller in communication with the memory device and configured to estimate an optimal read voltage associated with at least one of the erased state or one of the plurality of programmed states based on a threshold voltage distribution corresponding to at least one of the plurality of programmed states,
wherein the memory controller comprises:
a threshold voltage distribution checker configured to check a first threshold voltage distribution corresponding to a first programmed state, among the plurality of programmed states, and determine an average threshold voltage of the first threshold voltage distribution; and
an optimal read voltage estimator configured to estimate a second optimal read voltage corresponding to a second side of the first threshold voltage distribution, based on the average threshold voltage of the first threshold voltage distribution and a first optimal read voltage corresponding to a first side of the first threshold voltage distribution, and
wherein the optimal read voltage estimator is configured to estimate the second optimal read voltage so that a value, obtained by reflecting a first weight corresponding to channel characteristics of the memory cells in a difference value between the average threshold voltage of the first threshold voltage distribution and the first optimal read voltage, is equal to a difference value between the average threshold voltage of the first threshold voltage distribution and the second optimal read voltage.

2. The memory system according to claim 1, wherein the memory controller further comprises an optimal read voltage determiner configured to select one of preset values as the first optimal read voltage.

3. The memory system according to claim 1, wherein:
the threshold voltage distribution checker further checks a second threshold voltage distribution that is adjacent to the first side of the first threshold voltage distribution and that corresponds to a second programmed state, among the plurality of programmed states, and
the memory controller further comprises an optimal read voltage determiner configured to select a voltage corresponding to a valley between the first threshold voltage distribution and the second threshold voltage distribution as the first optimal read voltage.

4. The memory system according to claim 1, wherein the optimal read voltage estimator is configured to estimate an optimal read voltage level situated at the second side of the first threshold voltage distribution based on a value obtained by reflecting a second weight corresponding to the channel characteristics in a difference value between the first optimal read voltage and the second optimal read voltage.

5. The memory system according to claim 1, wherein the channel characteristics are related to at least one of a program/erase cycle or a retention time corresponding to the memory cells.

6. The memory system according to claim 1, wherein:
the first programmed state is adjacent to the erased state, and
the second optimal read voltage is a voltage for distinguishing the first programmed state from the erased state.

7. The memory system according to claim 1, wherein each of threshold voltage distributions respectively corresponding to the plurality of programmed states is a unimodal distribution or a distribution that is capable of being approximated to the unimodal distribution.

8. The memory system according to claim 1, wherein the memory controller further comprises a read operation controller configured to perform a read operation on the memory cells using the estimated second optimal read voltage.

9. A memory system, comprising:
a memory device including memory cells, each having a state corresponding to any one of an erased state and one of a plurality of programmed states; and
a memory controller in communication with the memory device and configured to estimate an optimal read voltage associated with at least one of the erased state and one of the plurality of programmed states based on a threshold voltage distribution corresponding to at least one of the plurality of programmed states,
wherein the memory controller comprises:
a threshold voltage distribution checker configured to check a first threshold voltage distribution corresponding to a first programmed state, among the plurality of programmed states, and determine an average threshold voltage of the first threshold voltage distribution; and
an optimal read voltage estimator configured to estimate a second optimal read voltage corresponding to a second side of the first threshold voltage distribution, based on the average threshold voltage of the first threshold voltage distribution and a first optimal read voltage corresponding to a first side of the first threshold voltage distribution, and wherein the optimal read voltage estimator is configured to estimate the second optimal read voltage so that a difference value between the average threshold voltage of the first threshold voltage distribution and the first optimal read voltage is equal to a difference value between the average threshold voltage of the first threshold voltage distribution and the second optimal read voltage.

10. The memory system according to claim 9, wherein:
the first programmed state is adjacent to the erased state, and
the second optimal read voltage is a voltage for distinguishing the first programmed state from the erased state.

11. A method of operating a memory system, the memory system including memory cells, each configured to have a state corresponding to one of an erased state or one of a plurality of programmed states, the method comprising:
determining an average threshold voltage of a first threshold voltage distribution corresponding to a first programmed state;
determining a first optimal read voltage corresponding to a first side of the first threshold voltage distribution; and
estimating a second optimal read voltage corresponding to a second side of the first threshold voltage distribution, based on the average threshold voltage of the first threshold voltage distribution and the first optimal read voltage,
wherein estimating the second optimal read voltage comprises:
calculating a difference value between the average threshold voltage of the first threshold voltage distribution and the first optimal read voltage;
reflecting a first weight corresponding to channel characteristics of the memory cells in the calculated difference value; and
estimating the second optimal read voltage so that the difference value in which the first weight is reflected is equal to a difference value between the average threshold voltage of the first threshold voltage distribution and the second optimal read voltage.

12. The method according to claim 11, wherein determining the first optimal read voltage comprises selecting one of preset values as the first optimal read voltage.

13. The method according to claim 11, further comprising checking a second threshold voltage distribution that is adjacent to the first side of the first threshold voltage distribution and that corresponds to a second programmed state, among the plurality of programmed states,
wherein determining the first optimal read voltage comprises selecting a voltage corresponding to a valley between the first threshold voltage distribution and the second threshold voltage distribution as the first optimal read voltage.

14. The method according to claim 11, further comprising:
calculating a difference value between the first optimal read voltage and the second optimal read voltage;
reflecting a second weight corresponding to the channel characteristics in the calculated difference value; and
estimating an optimal read voltage between threshold voltage distributions disposed on the second side of the first threshold voltage distribution based on the difference value in which the second weight is reflected.

15. The method according to claim 11, wherein the channel characteristics are related to at least one of a program/erase cycle or a retention time corresponding to the memory cells.

16. The method according to claim 11, wherein:
the first programmed state is adjacent to the erased state, and
the second optimal read voltage is a voltage for distinguishing the first programmed state from the erased state.

17. The method according to claim 11, wherein each of threshold voltage distributions respectively corresponding to the plurality of programmed states is a unimodal distribution or a distribution that is capable of being approximated to the unimodal distribution.

18. The method according to claim 11, further comprising performing a read operation on the memory cells using the estimated second optimal read voltage.

19. A method of operating a memory system, the memory system including memory cells, each configured to have a state corresponding to one of an erased state and one of a plurality of programmed states, the method comprising:
determining an average threshold voltage of a first threshold voltage distribution corresponding to a first programmed state;
determining a first optimal read voltage corresponding to a first side of the first threshold voltage distribution; and
estimating a second optimal read voltage corresponding to a second side of the first threshold voltage distribution, based on the average threshold voltage of the first threshold voltage distribution and the first optimal read voltage, wherein estimating the second optimal read voltage comprises:
calculating a difference value between the average threshold voltage of the first threshold voltage distribution and the first optimal read voltage; and
estimating the second optimal read voltage so that the calculated difference value is equal to a difference value between the average threshold voltage of the first threshold voltage distribution and the second optimal read voltage.

20. The method according to claim 19, wherein:
the first programmed state is adjacent to the erased state, and the second optimal read voltage is a voltage for distinguishing the first programmed state from the erased state.

* * * * *